(12) United States Patent
Kim et al.

(10) Patent No.: US 11,309,916 B2
(45) Date of Patent: Apr. 19, 2022

(54) ERROR CORRECTION CIRCUIT AND MEMORY CONTROLLER HAVING THE SAME

(71) Applicant: SK hynix Inc., Icheon-si (KR)

(72) Inventors: Dae Sung Kim, Icheon-si (KR); Jang Seob Kim, Seongnam-si (KR)

(73) Assignee: SK hynix Inc., Icheon-si (KR)

( * ) Notice: Subject to any disclaimer, the term of this patent is extended or adjusted under 35 U.S.C. 154(b) by 128 days.

(21) Appl. No.: 16/673,684

(22) Filed: Nov. 4, 2019

(65) Prior Publication Data

US 2020/0336156 A1 Oct. 22, 2020

(30) Foreign Application Priority Data

Apr. 17, 2019 (KR) .......................... 10-2019-0044847

(51) Int. Cl.
| | |
|---|---|
| *H03M 13/11* | (2006.01) |
| *G06F 11/10* | (2006.01) |
| *H03M 13/37* | (2006.01) |
| *H03M 13/00* | (2006.01) |

(52) U.S. Cl.
CPC ....... *H03M 13/116* (2013.01); *G06F 11/1012* (2013.01); *H03M 13/1185* (2013.01); *H03M 13/3776* (2013.01); *H03M 13/616* (2013.01)

(58) Field of Classification Search
None
See application file for complete search history.

(56) References Cited

U.S. PATENT DOCUMENTS

| | | | |
|---|---|---|---|
| 9,973,212 B2 | 5/2018 | Hung | |
| 2004/0034828 A1* | 2/2004 | Hocevar | .................. H04L 1/005 |
| | | | 714/800 |
| 2006/0015802 A1* | 1/2006 | Hocevar | .............. H03M 13/116 |
| | | | 714/805 |
| 2013/0031446 A1* | 1/2013 | Kamiya | .............. H03M 13/033 |
| | | | 714/781 |
| 2015/0311919 A1* | 10/2015 | Karimi | ............... H03M 13/1134 |
| | | | 714/776 |
| 2015/0381210 A1* | 12/2015 | Doi | ..................... H03M 13/616 |
| | | | 714/752 |

(Continued)

FOREIGN PATENT DOCUMENTS

KR 1020160005914 1/2016

*Primary Examiner* — Cynthia Britt
*Assistant Examiner* — Matthew W Wahlin
(74) *Attorney, Agent, or Firm* — Perkins Coie LLP

(57) ABSTRACT

Disclosed are devices, systems and methods for error correction encoding and decoding. A memory controller includes an error correction encoder for generating a codeword by performing error correction encoding, using a parity check matrix including a plurality of sub-matrices; and an error correction decoder for performing error correction decoding on a read vector corresponding to the codeword on a column layer basis while sequentially selecting column layers of the parity check matrix used for the error correction encoding, in the error correction decoding, the column layer including a set of columns of the parity check matrix. Rows included in the parity check matrix are grouped into a plurality of row groups, and at most one cyclic permutation matrix (CPM) is included for each column layer in each of the row groups.

16 Claims, 22 Drawing Sheets

(56) References Cited

U.S. PATENT DOCUMENTS

| | | | |
|---|---|---|---|
| 2016/0013809 A1* | 1/2016 | Myung | H03M 13/616 |
| | | | 714/776 |
| 2017/0134050 A1* | 5/2017 | Abu-Surra | H04L 1/0045 |
| 2019/0044537 A1* | 2/2019 | Reynwar | H03M 13/3723 |

* cited by examiner

FIG. 7

| QUANTIZATION LEVEL | LLR1 | LLR2 | LLR3 | LLR4 | LLR5 | LLR6 | LLR7 | LLR8 |
|---|---|---|---|---|---|---|---|---|
| 2 | −4 | +4 | | | | | | |
| 3 | −4 | −2 | +4 | | | | | |
| 4 | −4 | −2 | +2 | +4 | | | | |
| 5 | −4 | −3 | −2 | +2 | +4 | | | |
| 6 | −4 | −3 | −2 | −1 | +2 | +4 | | |
| 7 | −4 | −3 | −2 | −1 | +1 | +2 | +4 | |
| 8 | −4 | −3 | −2 | −1 | +1 | +2 | +3 | +4 |

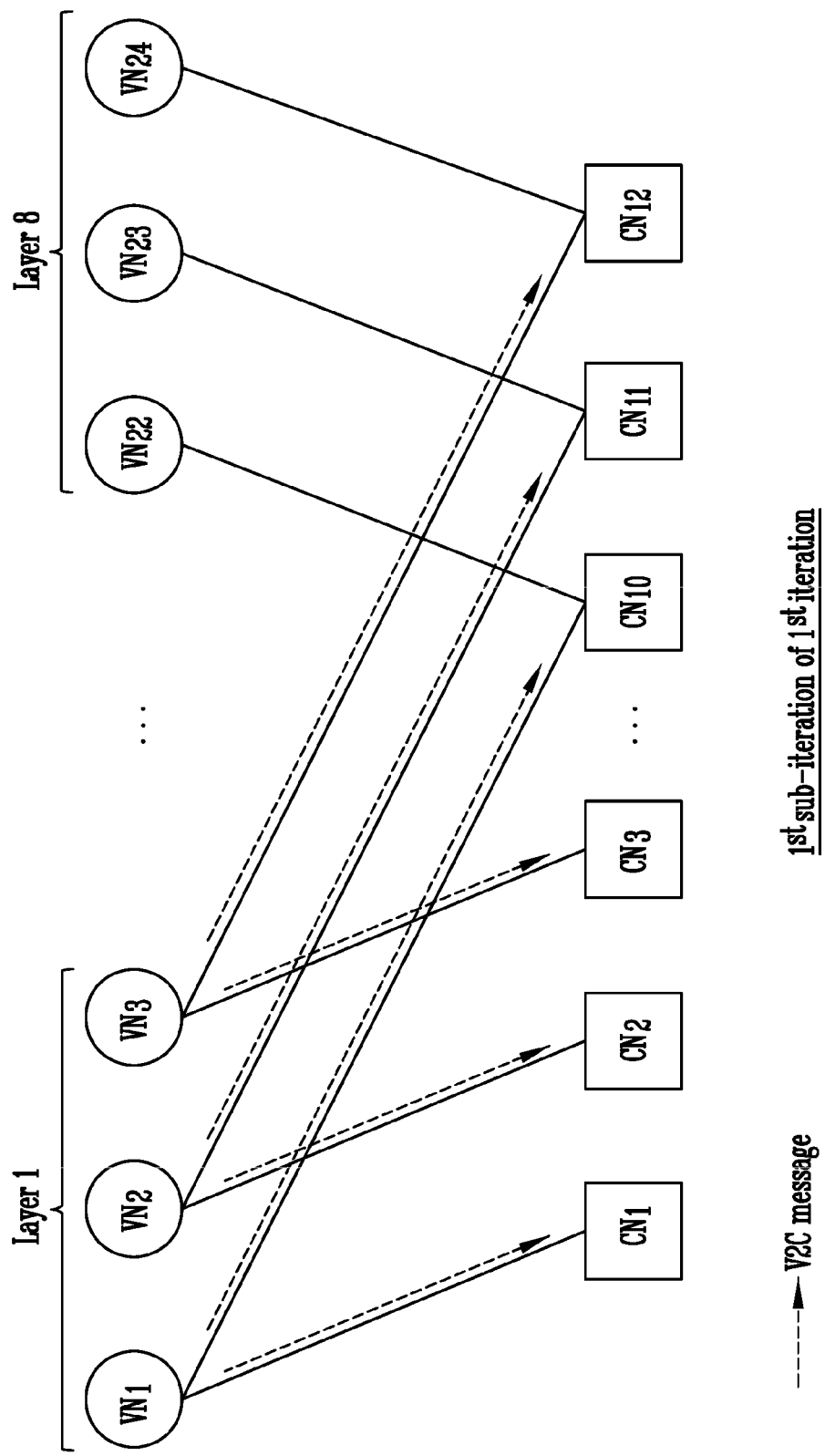

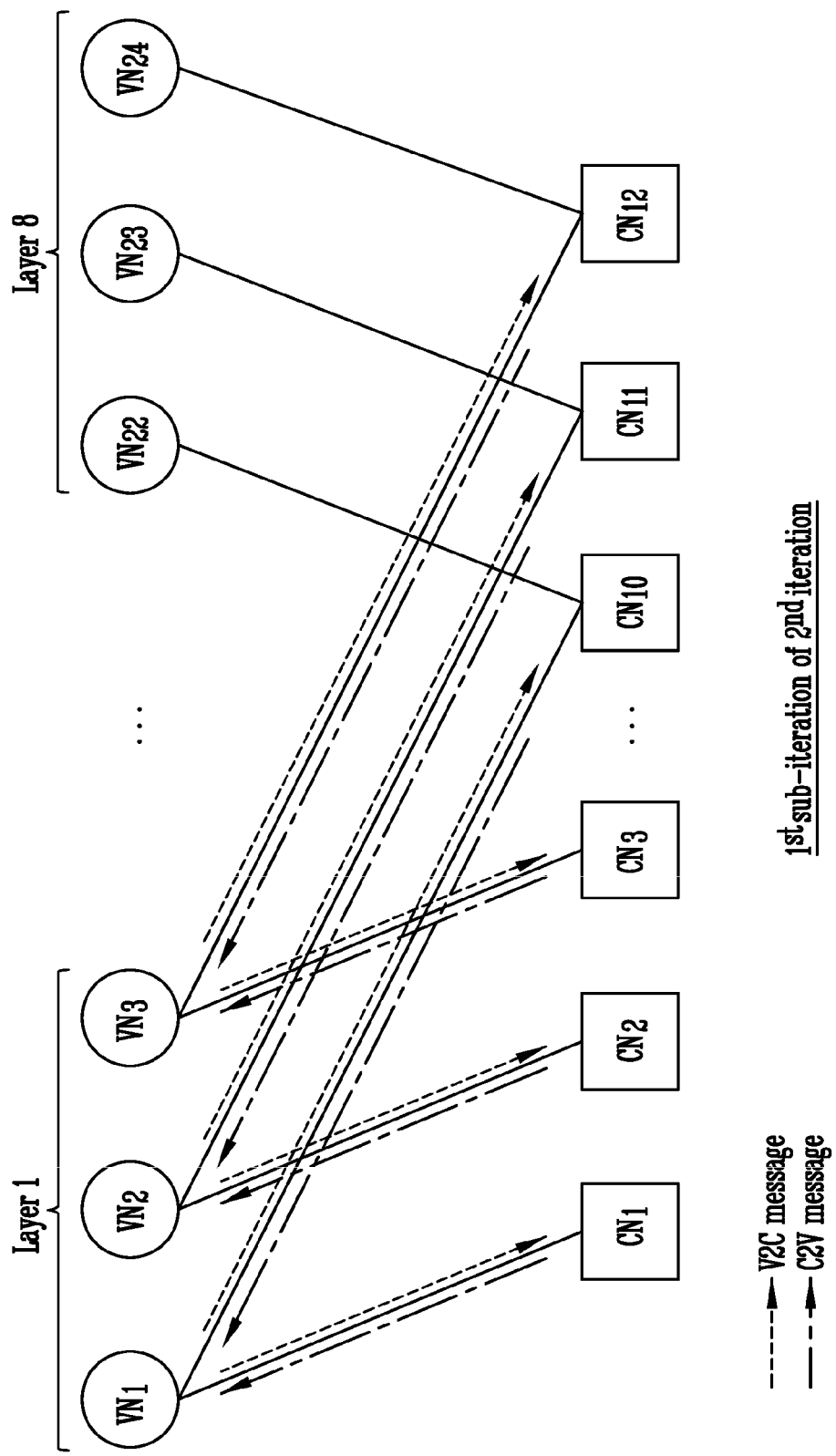

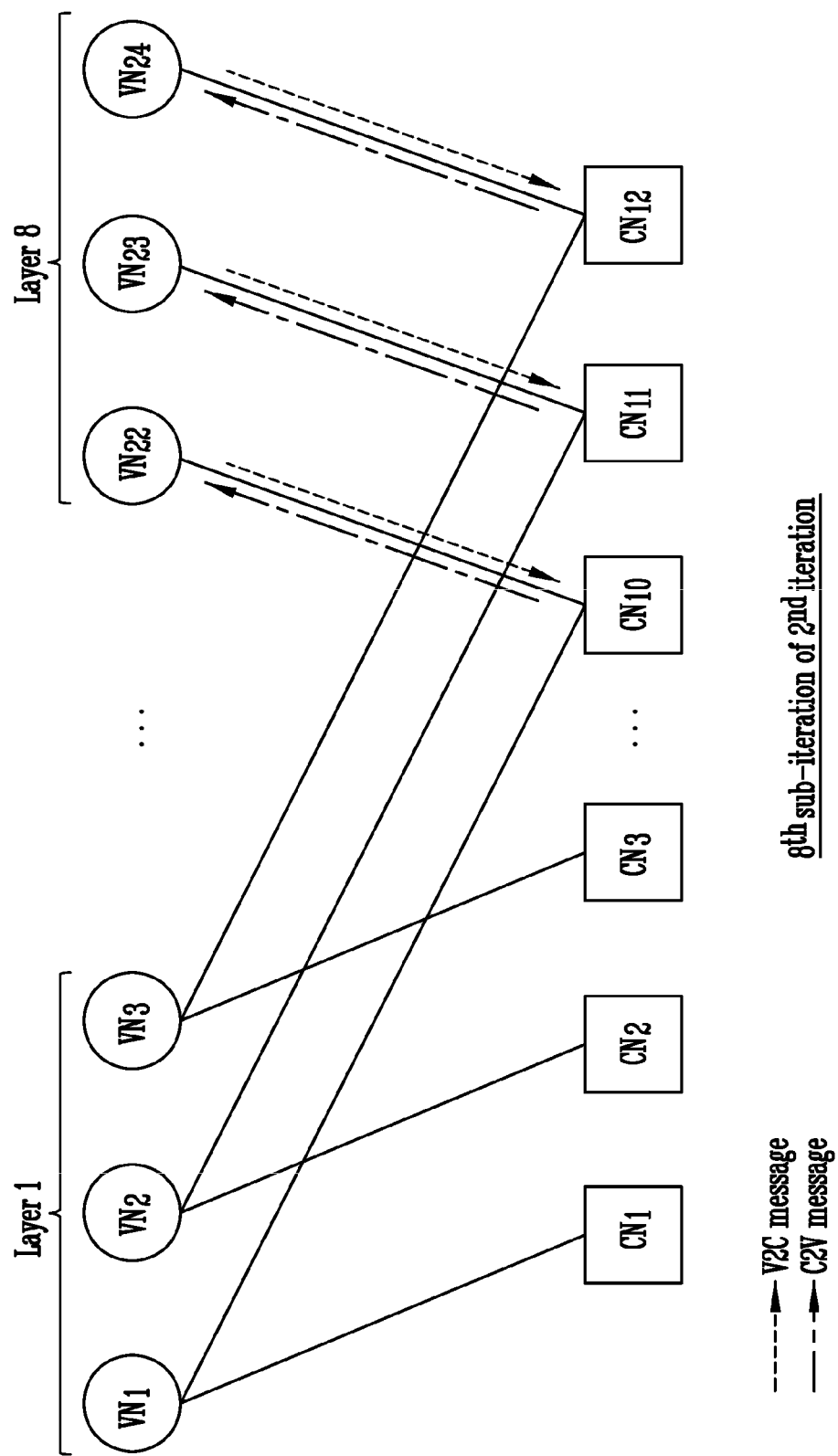

ated with the parity check matrix shown in FIG.

ERROR CORRECTION CIRCUIT AND MEMORY CONTROLLER HAVING THE SAME

CROSS-REFERENCE TO RELATED APPLICATION

This patent document claims priority to and benefits of the Korean patent application number 10-2019-0044847, filed on Apr. 17, 2019, which is incorporated herein by reference in its entirety.

TECHNICAL FIELD

The disclosed technology generally relates to an error correction circuit and a memory controller having the same, and more particularly, to an error correction circuit configured to enable low complexity error correction encoding and low complexity error correction decoding, and a memory controller having the error correction circuit.

BACKGROUND

A memory system may store data provided from an external device and provide stored data to the external device. For the purposes of ensuring data integrity, the memory system may include an error correction circuit to perform error correction operation on the data stored in the memory system. The error correction circuit may perform error correction encoding and error correction decoding by using an error correction code.

A low density parity check (LDPC) coding is a powerful error correction scheme that allows the memory system to detect and correct certain number of errors depending on the code length. The LDPC coding scheme can improve error correction capability per bit by increasing the code length, while maintaining the computational complexity per bit. However, the computational complexity of LDPC codes can still cause inefficiencies in storing parity check matrices that are needed to produce a successful decoding.

SUMMARY

The embodiments of this patent documents relate to error correction circuits for low complexity error correction encoding and decoding and memory controllers having the error correction circuits.

In an implementation of the disclosed technology, an error correction circuit includes an error correction decoder configured to perform error correction decoding on a read vector on a column layer basis while sequentially selecting column layers of a parity check matrix including a plurality of sub-matrices. The column layer includes a set of columns of the parity check matrix, and the error correction decoder includes a plurality of memory areas configured to store values of a plurality of check nodes corresponding to the parity check matrix, and a check node processor configured to access on or more of the plurality of memory areas corresponding to cyclic permutation matrices (CPMs) included in a currently selected column layer, and update values of check nodes stored in the accessed one or more memory areas. Rows included in the parity check matrix are grouped into a plurality of row groups, and at most one CPM is included for each column layer in each of the row groups.

In another implementation of the disclosed technology, a memory controller includes an error correction encoder configured to generate a codeword by performing error correction encoding, using a parity check matrix including a plurality of sub-matrices, and an error correction decoder configured to perform error correction decoding on a read vector corresponding to the codeword on a column layer basis while sequentially selecting column layers of the parity check matrix used for the error correction encoding, in the error correction decoding. The column layer includes a set of columns of the parity check matrix, wherein rows included in the parity check matrix are grouped into a plurality of row groups, and at most one cyclic permutation matrix (CPM) is included for each column layer in each of the row groups.

In another implementation of the disclosed technology, an error correction circuit includes an error correction decoder configured to perform error correction decoding on a read vector in units of column layers while sequentially selecting column layers of a parity check matrix configured with sub-matrices. The error correction decoder includes a plurality of memory areas configured to store values of a plurality of check nodes corresponding to the parity check matrix, and a check node processor configured to access memory areas corresponding to cyclic permutation matrices (CPMs) included in a currently selected column layer among the plurality of memory areas, and update values of check nodes, which are stored in the accessed memory areas. Rows included in the parity check matrix are grouped into a plurality of row groups, and at most one CPM is included for each column layer in each of the row groups.

In another implementation of the disclosed technology, a memory controller includes an error correction encoder configured to generate a codeword by performing error correction encoding, using a parity check matrix configured with sub-matrices, and an error correction decoder configured to perform error correction decoding on a read vector corresponding to the codeword in units of column layers while sequentially selecting column layers of the parity check matrix used for the error correction encoding, in the error correction decoding. Rows included in the parity check matrix are grouped into a plurality of row groups, and at most one CPM is included for each column layer in each of the row groups.

BRIEF DESCRIPTION OF THE DRAWINGS

FIG. 7 is a diagram illustrating an example of a lookup table with example quantization levels and an associated LLR values.

FIG. 8A is a Tanner graph representation and corresponding message passing used in a first sub-iteration of a first iteration based on an example of a column-layered scheme.

FIG. 8C is another Tanner graph representation and corresponding message passing used in a first sub-iteration of a second iteration based on an example of the column-layered scheme.

FIG. 8D is another Tanner graph representation and corresponding message passing used in an eighth sub-iteration of the second iteration based on an example of the column-layered scheme.

DETAILED DESCRIPTION

The specific structural or functional description disclosed herein is merely illustrative for the purpose of describing embodiments according to the concept of the present disclosure. The embodiments according to the concept of the present disclosure can be implemented in various forms, and cannot be construed as limited to the embodiments set forth herein.

Figure 1:
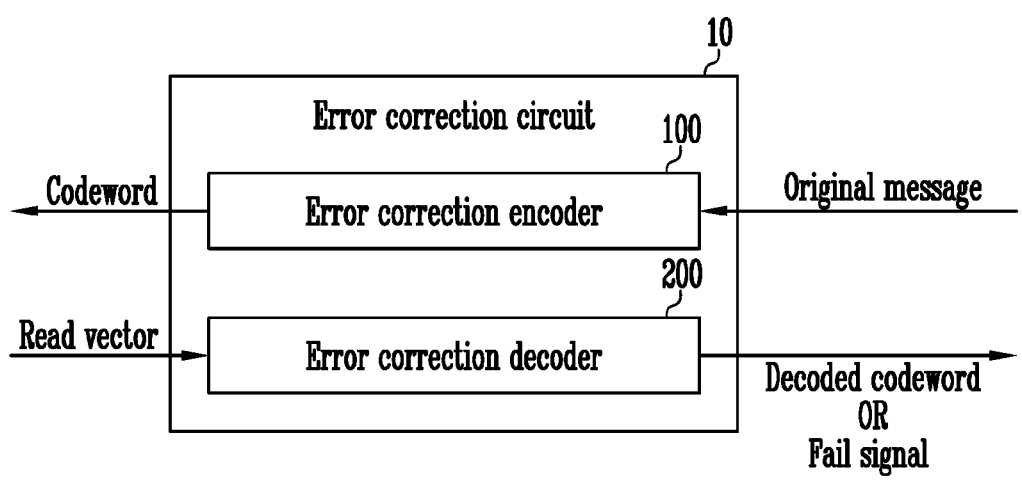
FIG. 1 is a diagram illustrating an example of an error correction circuit based on an embodiment of the disclosed technology.

FIG. 1 is a diagram illustrating an example of an error correction circuit based on an embodiment of the disclosed technology.

Referring to FIG. 1, the error correction circuit 10 may include an error correction encoder 100 and an error correction decoder 200.

The error correction encoder 100 may receive an original message that is intended to be encoded. The error correction encoder 100 may perform the error correction encoding by using the received original message and a generator matrix of an error correction code (ECC) or may perform the error correction encoding by using the received original message and a parity check matrix of the ECC.

Error correction coding enables errors that may be introduced into digital data as a result of transmission through a communication channel be corrected based upon received data. The channel is the medium over which the data is conveyed. Examples of channels are telephone lines, cell phone channels, etc. Data storage and memory device such as hard drives and solid memory are other examples of channels.

Error Correction Codes (ECCs) are used in NAND Flash memories to detect and correct bit errors. With increased memory complexity, bit error rates continue to grow. With increasing usage of memory devices that store more than one bit per memory cell, this issue has become even more critical. In order to determine the values that are read from memory, threshold voltages are used to decide on the value of the read information. For example, for an n-bit multi-level cell NAND flash memory, the threshold voltage of each cell can be programmed to 2' possible values. In an ideal multi-level cell NAND flash memory, each value corresponds to a non-overlapping threshold voltage window. Memory cells programmed to store the same value have their threshold voltages fall into the same window, but their exact threshold voltages could be different. As program/erase cycles increase, the margin between neighboring threshold voltage distributions of different programmed states decreases and eventually the distributions start to overlap. As a result, the memory cells with threshold voltages that fall within the overlapping range of the neighboring distributions may be read as being programmed to a value other than the original targeted value and thus cause read errors. Such read errors may be managed in most situations by using the ECC.

The error correction encoder 100 may output, to a channel, a codeword obtained by performing the error correction encoding.

In an implementation, the channel may comprise a wired or wireless medium through which the information is transferred or a storage medium in which the information is stored. In one example, when the error correction circuit 10 is applied to a memory system, the channel may include an interface that is used to communicate data between the error correction circuit 10 and the memory device. In another example, the channel may include the memory device itself. The codeword may be stored in a plurality of memory cells included in the memory device (e.g., memory cells constituting one page).

The error correction encoder 100 may use a low-density parity check (LDPC) code as the ECC. By the way of example and not by limitation, the error correction encoder 100 may use quasi-cyclic low-density parity check (QC-LDPC) code as the ECC.

The error correction decoder 200 may receive a read vector corresponding to the codeword from the channel, and perform error correction decoding by using the received read vector and a parity check matrix of an ECC. The parity check matrix used for the error correction decoding may be identical to the parity check matrix used for the error correction encoding. In an implementation of the disclosed technology, the read vector may indicate a value that is read from a memory device; for example, a read operation conducted over a memory cell may produce a binary value of either zero or one in a binary storage scheme. In one example, the read vector may include a multi-level quantized read vector obtained by combining read vectors indicating multiple threshold voltage distributions of memory cells, each of which can be distinguished from other distributions using multiple read voltages.

The error correction decoder 200 may perform the error correction decoding by using various algorithms adopting an iterative decoding scheme. For example, the error correction decoder 200 may perform the error correction decoding by using a message passing algorithm (MPA) that is also referred to as a belief propagation algorithm (BPA). For example, the error correction decoder 200 may perform the error correction decoding by using a sum-product algorithm or min-sum algorithm, but embodiments of the disclosed technology are not limited thereto.

The error correction decoder 200 may perform the error correction decoding by performing at least one iteration without exceeding a maximum number of iterations, I, specified in the iterative decoding scheme. When a codeword satisfying constraints of the parity check matrix of the ECC within the maximum number of iterations, I, is generated, that codeword can be called a "valid codeword," and the error correction decoder 200 may output the generated valid codeword as a decoded codeword. When the valid codeword satisfying the constraints of the parity check matrix of the ECC within the maximum number of iterations, I, is not generated, the error correction decoder 200 may output a "fail" signal representing that the error correction decoding has failed. The error correction decoder 200 may use an LDPC code as the ECC. By the way of example and not by limitation, the error correction decoder 200 may use a QC-LDPC code as the ECC.

The error correction decoder 200 may perform hard decision decoding or soft decision decoding.

The error correction decoder 200 may perform the error correction decoding by using a column-layered scheme. In an implementation, the error correction decoder 200 may perform the error correction decoding on the read vector on a column layer basis while sequentially selecting column layers of the parity check matrix configured with sub-matrices. The column-layered scheme will be described later with reference to related drawings. In the context of this patent document, the word "column layer" can indicate a set of columns of a parity check matrix.

Although not shown in the drawing, the error correction circuit 10 may further include a post processor configured to support the error correction decoder 200 such that the error correction decoder 200 can generate a valid codeword. The post processor may correct various types of parameters used for the error correction decoding, and support the error correction decoder 200 such that error correction decoding can be performed using the corrected parameters.

Figure 2:
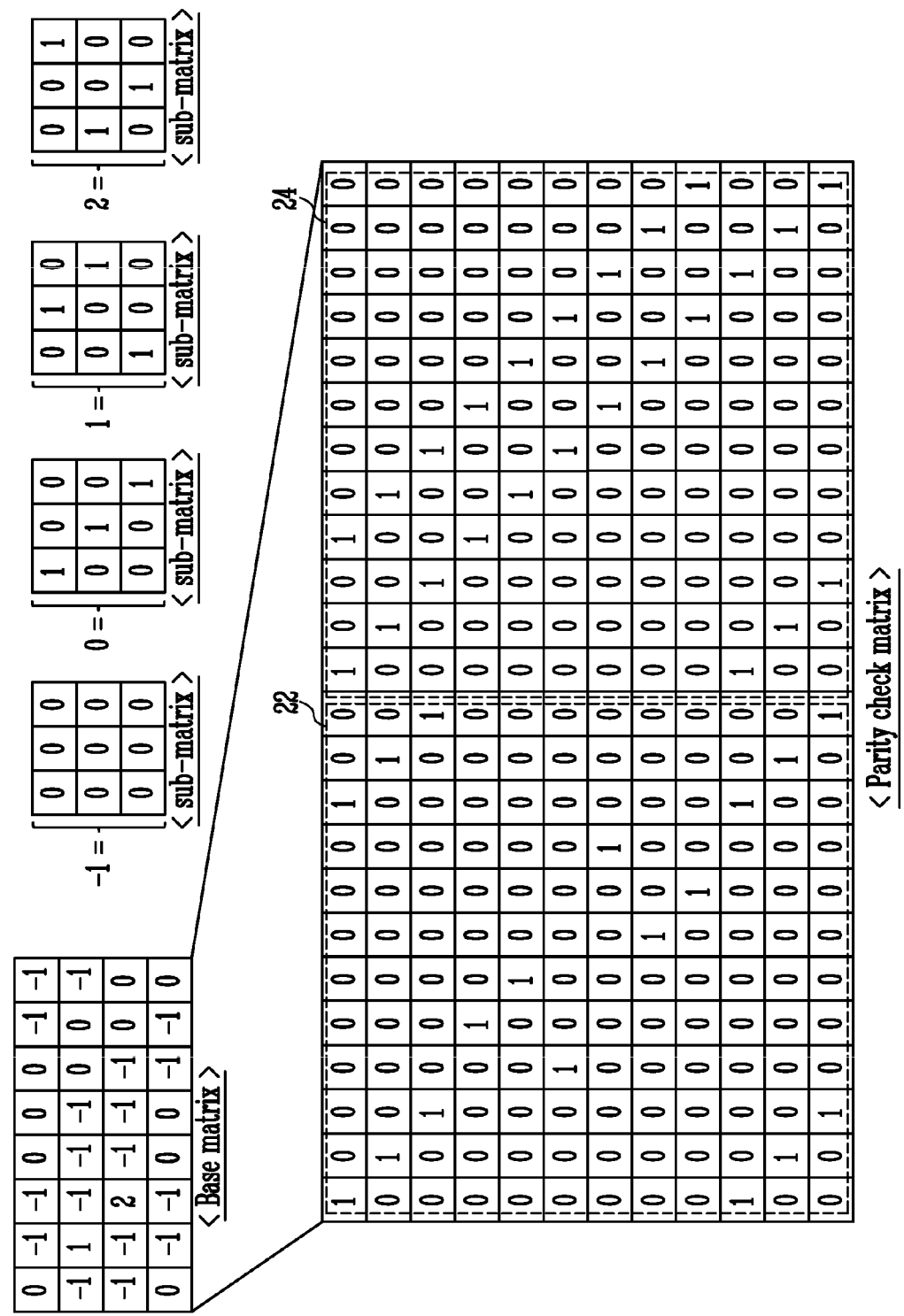
FIG. 2 is a diagram illustrating an example of a parity check matrix.

FIG. 2 is a diagram illustrating an example of a parity check matrix.

An (n, k) code may be defined as a parity check matrix having a size of (n−k)×n. Here, k represents a length of an original message, and n−k represents the number of parity symbols. Each entry of the parity check matrix may be '0' or '1.' When a number of '1s' is relatively smaller than that of '0s,' the (n, k) code may be referred to as an (n, k) LDPC code. Here, n and k may be natural numbers. In an example, a parity check matrix defining a (24, 12) code is illustrated in FIG. 2.

When a parity check matrix in which '1s' are randomly arranged is used, a large amount of memory will be required to store the parity check matrix. In an attempt to minimize the required amount of memory, a QC-LDPC code can be used. A parity check matrix of the QC-LDPC code may be configured with a plurality of sub-matrices, and each sub-matrix may be a zero matrix or cyclic permutation matrix (CPM).

The parity check matrix of the QC-LDPC code may be constructed by "lifting" from a base matrix. In some implementations, entries included in the base matrix may be respectively replaced with sub-matrices such that a parity check matrix is generated. For example, an entry indicated by '−1' in the base matrix may be replaced with a zero matrix, and an entry indicated by '0' in the base matrix may be replaced with an identity matrix. In addition, an entry indicated by '1' in the base matrix may be replaced with a sub-matrix obtained by performing a cyclic shift to the right on the identify matrix, and an entry indicated by '2' in the base matrix may be replaced with a sub-matrix obtained by performing two cyclic shifts to the right on the identity matrix.

Hereinafter, when the sub-matrix is a CPM, the CPM may indicate an identity matrix or a sub-matrix obtained by performing a predetermined number of cyclic shifts on the identify matrix.

In some implementations, a dual diagonal structure that enables low complexity error correction encoding may be used for error correction encoding. For example, the parity check matrix may include a message area 22 and a parity area 24. When a parity check matrix in which '1s' are arranged in the dual diagonal structure in the parity area 24 is used in the error correction encoding, the low complexity error correction encoding may be performed.

Figures 3, 4:
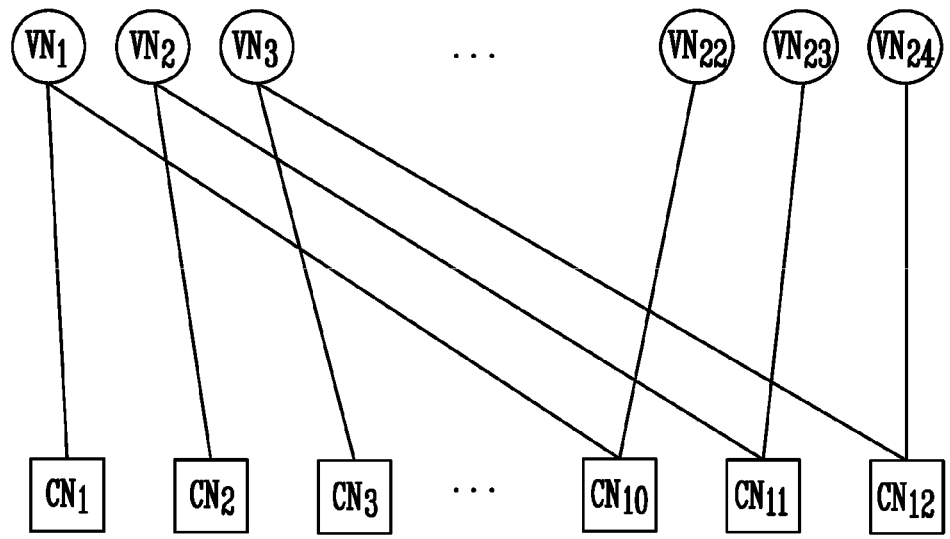
FIG. 3 is a diagram illustrating an example of a Tanner graph associated with the parity check matrix shown in FIG. 2.
FIG. 4 is a diagram illustrating an example of a syndrome vector calculated using the parity check matrix shown in FIG. 2.

FIG. 3 is a diagram illustrating an example of a Tanner graph associated with the parity check matrix shown in FIG. 2.

The (n, k) code may be represented by a Tanner graph which is an expression of an equivalent bipartite graph. The Tanner graph may be represented using (n−k) check nodes, n variable nodes, and edges. The check nodes correspond to rows of the parity check matrix, and variable nodes correspond to columns of the parity check matrix. Each edge connects one check node to one variable node, and represents an entry indicated by '1' in the parity check matrix.

The parity check matrix of the (24, 12) code shown in FIG. 2 may be represented by the Tanner graph that includes 12 check nodes $CN_1$ to $CN_{12}$ and 24 variable nodes $VN_1$ to $VN_{24}$ as shown in FIG. 3. Solid lines connecting the check nodes $CN_1$ to $CN_{12}$ to the variable nodes $VN_1$ to $VN_{24}$ represent edges.

In some embodiments of the disclosed technology, iterative decoding may be performed, based on a message passing algorithm on the Tanner graph, through exchange of messages between the check nodes $CN_1$ to $CN_{12}$ and the variable nodes $VN_1$ to $VN_{24}$. For example, the iterative decoding may be performed by transferring messages between the check nodes $CN_1$ to $CN_{12}$ and the variable nodes $VN_1$ to $VN_{24}$ for each iteration.

FIG. 4 is a diagram illustrating an example of a syndrome vector calculated using the parity check matrix shown in FIG. 2.

A syndrome vector $S_i$ may be expressed as a product of a parity check matrix H and a transposed vector $C_i^T$ of a hard decision vector $C_i$ corresponding to an ith iteration, where the hard decision vector $C_i$ is a row vector.

All of symbols $S_{i1}$ to $S_{i12}$ of the syndrome vector $S_i$ being '0' indicates that a syndrome check has passed (succeeded) in the ith iteration, indicating that error correction decoding on a read vector has been successfully performed in the ith iteration. Therefore, iterative decoding on the corresponding read vector may be ended, and the hard decision vector $C_i$ corresponding to the ith iteration may be output as a decoded codeword.

On the contrary, at least one non-zero symbol among all the symbols $S_{i1}$ to $S_{i12}$ of the syndrome vector $S_i$ may indicate that the syndrome check has failed (e.g., the error correction decoding has not succeeded in the ith iteration). Therefore, if the current iteration has not exceeded the maximum number of iterations I, a subsequent iteration may be performed. On the other hand, when the current iteration has reached the maximum number of iterations I, the iterative decoding of the current read vector may be terminated, and the error correction decoding operation is deemed to have failed.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, and such read errors may be managed in most situations by using error correction codes (ECC).

Figure 5:
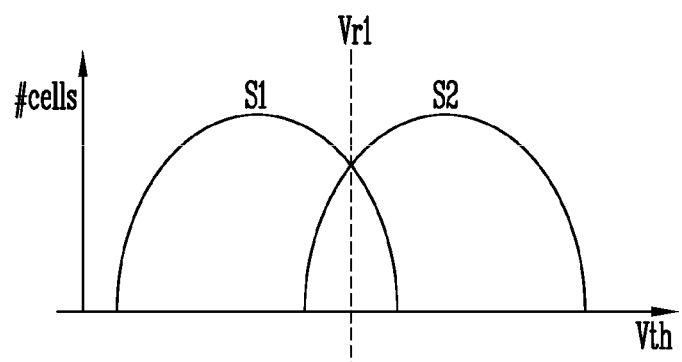
FIG. 5 is a diagram illustrating an example process of generating an initial value by using one read value in hard decision decoding.
Figure 6:
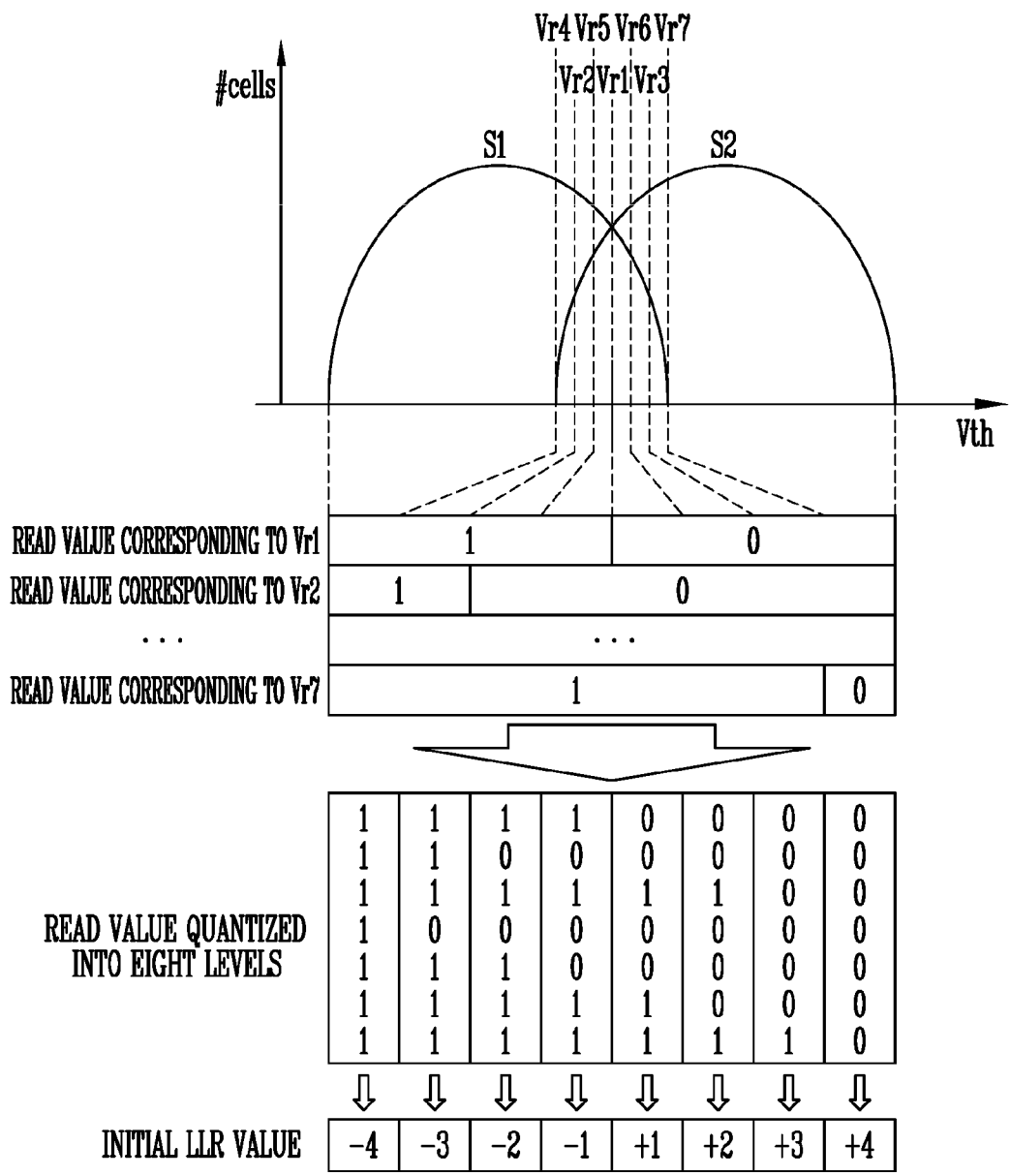
FIG. 6 is a diagram illustrating an example process of generating an initial value by using g read values in soft decision decoding.

FIGS. 5 and 6 show overlapped threshold voltage distributions. Memory cells programmed to the same value have their threshold voltages fall into the same window, but their exact threshold voltages could be different. As program/erase cycles increase, the margin between neighboring threshold voltage distributions of different programmed states decreases and eventually the distributions start overlapping. As a result, the memory cells with threshold voltages that fall within the overlapping range of the neighboring distributions may be read as being programmed to a value other than the original targeted value and thus cause read errors. Such read errors may be managed in most situations by using error correction codes (ECC).

FIG. 5 is a diagram illustrating an example process of generating an initial value by using one read value in hard decision decoding.

In FIG. 5, threshold voltage (Vth) distributions of memory cells each having any one of a first state S1 and a second state S2 are illustrated.

In FIG. 5, the vertical axis indicates the number of memory cells (#cells) that has a particular threshold voltage represented on the horizontal axis.

In order to acquire one read vector corresponding to one codeword, one read voltage Vr1 may be applied to a plurality of memory cells (e.g., memory cells constituting one page) that store one codeword. Accordingly, one read value can be acquired per memory cell. The one read vector may be configured with read values corresponding to the plurality of memory cells.

For example, when a first read voltage Vr1 is applied to a plurality of memory cells, a read value of a memory cell having a threshold lower than the first read voltage Vr1 may be represented as '1,' and a read value of a memory cell having a threshold voltage higher than the first read voltage Vr1 may be represented as '0.' The read value corresponding to the first read voltage Vr1 may be a read value quantized into 2-levels.

The error correction circuit 10 may convert a read value quantized into 2-levels into initial value (e.g., an initial LLR value). The conversion into the initial value may be performed with reference to a set lookup table.

FIG. 6 is a diagram illustrating an example process of generating an initial value by using g read values in soft decision decoding.

In FIG. 6, the vertical axis indicates the number of memory cells (#cells) that has a particular threshold voltage represented on the horizontal axis.

In FIG. 6, threshold voltage (Vth) distributions of memory cells each having any one of a first state S1 and a second state S2 are illustrated.

When a (g+1)-level quantization is used, g read voltages may be sequentially to a plurality of memory cells so as to acquire g read vectors corresponding to single codeword. Here, g may be a natural number. For example, as shown in FIG. 6, when a 2-level quantization is used, one read voltage Vr1 may be applied. When a 3-level quantization is used, two read voltages Vr1 and Vr2 may be sequentially applied. Similarly, when an 8-level quantization is used, seven read voltages Vr1 to Vr7 may be sequentially applied. Thus, when the (g+1)-level quantization is used, g read values may be acquired per memory cell.

When any one read voltage among the g read voltages is applied to the plurality of memory cells, a read value of a memory cell having a threshold lower than the applied read voltage may be represented as '1,' and a read value of a memory cell having a threshold voltage higher than the applied read voltage may be represented as '0.'

The error correction circuit 10 may generate a read value quantized into g+1 levels by coupling read values corresponding to the g read voltages. For example, as shown in FIG. 6, when the seven read voltages Vr1 to Vr7 are used, the error correction circuit 10 may generate a read value quantized into eight levels by coupling read values corresponding to the seven read voltages Vr1 to Vr7.

The error correction circuit may convert the (g+1)-level quantized read value into an initial value (e.g., an initial LLR value). The conversion into the initial value may be performed based on a lookup table.

FIG. 7 is a diagram illustrating an example of a lookup table.

Referring to FIG. 7, the lookup table may define LLR values corresponding to each of a plurality of quantization levels.

The error correction circuit 10 may convert each of the (g+1)-level quantized read values into any one of g+1 LLR values corresponding to the (g+1) quantization levels based on the lookup table.

For example, when a 2-level quantization is used, the error correction circuit may convert one of 2-level quantized read values into LLR1, and convert the other of the 2-level quantized read values into LLR2. For example, a '1' of the 2-level quantized read values may be converted into LLR1 value of '−4', and a '0' of the 2-level quantized read values may be converted into LLR2 value of '+4'.

In embodiments of the disclosed technology, "read values" may mean read values quantized into g+1 levels.

Figure 8B:
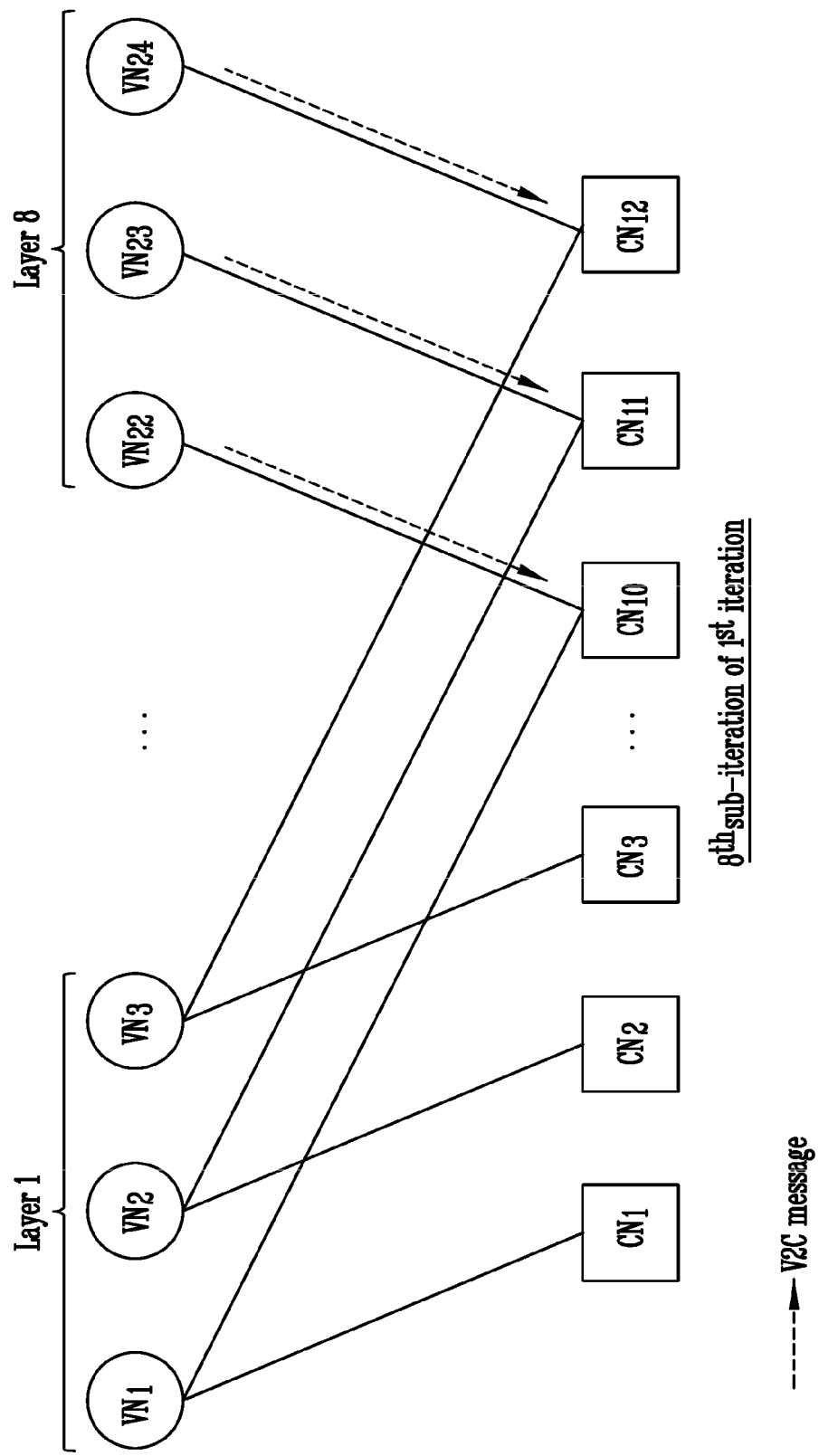
FIG. 8B is another Tanner graph representation and corresponding message passing used in an eighth sub-iteration of the first iteration based on an example of the column-layered scheme.

FIGS. 8A to 8D are diagrams illustrating an example of a column-layered scheme. FIG. 8A is a Tanner graph representation and corresponding message passing used in a first sub-iteration of a first iteration based on an example of a column-layered scheme. FIG. 8B is another Tanner graph representation and corresponding message passing used in an eighth sub-iteration of the first iteration based on an example of the column-layered scheme. FIG. 8C is another Tanner graph representation and corresponding message passing used in a first sub-iteration of a second iteration based on an example of the column-layered scheme. FIG. 8D is another Tanner graph representation and corresponding message passing used in an eighth sub-iteration of the second iteration based on an example of the column-layered scheme.

The MPA may be classified into a flooding scheme, a row-layered scheme, and a column-layered scheme according to a scheduling scheme.

In the flooding scheme, updating is simultaneously performed on all check nodes in each iteration, and updating is simultaneously performed on all variable nodes in each iteration. That is, in the flooding scheme, it is necessary to update values of all the variable nodes before values of all the check nodes are updated for each iteration. Similarly, it is necessary to update values of all the check nodes before values of all the variable nodes are updated for each iteration. It may be inefficient to wait until values of all the check nodes are updated to update values of all the variable nodes or to wait until values of all the variable nodes are updated to update values of all the check nodes.

In the row-layered scheme, rows of a parity check matrix are grouped into row layers. In the row-layered scheme, values of variable nodes associated with a current row layer may be updated based on values of check nodes belonging to previous row layers, and values of check nodes belonging to the current row layer may be updated based on the updated values of the variable nodes. The row-layered scheme generally exhibits high performance (e.g., rapid convergence), but requires high memory bandwidth to exchange information between row layers.

In the column-layered scheme, columns of a parity check matrix are grouped into column layers. In the column-layered scheme, values of variable nodes belonging to a current column layer or currently activated column layer may be updated based on values of check nodes associated with previous column layers, and values of check nodes associated with the current column layer or currently activated column layer may be updated based on the updated values of the variable nodes. That is, in the column-layered scheme, a calculation result of a certain variable node can affect the value of a variable node that is subsequently calculated. Thus, the column-layered scheme can have a faster conversion rate than the flooding scheme. In addition, since check nodes are independently processed in the column-layered scheme, the column-layered scheme can work with a narrower memory bandwidth compared to the row-layered scheme.

In the column-layered scheme, each iteration may include a sub-iteration corresponding to each of a plurality of column layers. Hereinafter, the word "layer" indicates the column layer. The column-layered scheme will be described in more detail with reference to FIGS. 8A to 8D. In FIGS. 8A to 8D, eight layers layer 1 to layer 8 each including three variable nodes are illustrated.

As shown in FIG. 8A, variable-node-to-check-node (V2C) messages generated in variable node $VN_1$, $VN_2$, and $VN_3$ belonging to layer 1 may be passed to check nodes $CN_1$, $CN_2$, $CN_3$, $CN_{10}$, $CN_{11}$, and $CN_{12}$ in a $1^{st}$ sub-iteration of a $1^{st}$ iteration. Subsequently, in $2^{nd}$ sub-iteration to $7^{th}$ sub-iteration of the $1^{st}$ iteration, which are sequentially performed, V2C messages generated in variable nodes belonging to layer 2 to layer 7 may be passed to check nodes connected to the corresponding variable nodes. Then, V2C messages generated in variable nodes $VN_{22}$, $VN_{23}$, and $VN_{24}$ belonging to layer 8 may be passed to the check nodes $CN_{10}$, $CN_{11}$, and $CN_{12}$ in an $8^{th}$ sub-iteration of the $1^{st}$ iteration.

In the $1^{st}$ iteration described with reference to FIGS. 8A and 8B, V2C messages are passed from variable nodes to check nodes, but check-node-to-variable-node (C2V) messages are not passed from the check nodes to the variable nodes. Therefore, in the $1^{st}$ iteration, values of check nodes are updated, but values of variable nodes are not updated.

Subsequently, as shown in FIG. 8C, C2V messages generated in the check nodes $CN_1$, $CN_2$, $CN_3$, $CN_{10}$, $CN_{11}$, and $CN_{12}$ may be passed to the variable node $VN_1$, $VN_2$, and $VN_3$ belonging to the layer 1 in a $1^{st}$ sub-iteration of a $2^{nd}$ iteration. Hard decision values of the variable node $VN_1$, $VN_2$, and $VN_3$ may be updated based on the C2V messages received from the check nodes $CN_1$, $CN_2$, $CN_3$, $CN_{10}$, $CN_{11}$, and $CN_{12}$, and V2C messages may be generated to be passed to the check nodes $CN_1$, $CN_2$, $CN_3$, $CN_{10}$, $CN_{11}$, and $CN_{12}$. Then, values of the check nodes $CN_1$, $CN_2$, $CN_3$, $CN_{10}$, $CN_{11}$, and $CN_{12}$ may be updated based on the V2C messages received from the variable node $VN_1$, $VN_2$, and $VN_3$.

Subsequently, $2^{nd}$ to $7^{th}$ sub-iterations of the $2^{nd}$ iteration, which are sequentially performed, C2V messages generated in check nodes associated with the layer 2 to the layer 7 may be passed to variable nodes belonging to the layer 2 to the layer 7. Therefore, hard decision values of the variable nodes belonging to the layer 2 to the layer 7 may be updated, and V2C messages may be generated to be passed to check nodes associated with the layer 2 to the layer 7. Accordingly, values of the check nodes associated with the layer 2 to the layer 7 can be updated.

In addition, as shown in FIG. 8D, C2V messages generated in the check nodes $CN_{10}$, $CN_{11}$, and $CN_{12}$ may be passed to variable nodes $VN_{22}$, $VN_{23}$, and $VN_{24}$ belonging to the layer 8 in an $8^{th}$ sub-iteration of the $2^{nd}$ iteration. Hard decision values of the variable nodes $VN_{22}$, $VN_{23}$, and $VN_{24}$ may be updated based on the C2V messages received from the check nodes $CN_{10}$, $CN_{11}$, and $CN_{12}$, and V2C messages may be generated to be passed to the check nodes $CN_{10}$, $CN_{11}$, and $CN_{12}$. In addition, values of the check nodes $CN_{10}$, $CN_{11}$, and $CN_{12}$ may be updated based on the V2C messages received from the variable nodes $VN_{22}$, $VN_{23}$, and $VN_{24}$.

Iterations after the $2^{nd}$ iteration may be performed in a manner similar to that described for the $2^{nd}$ iteration.

Figure 9:
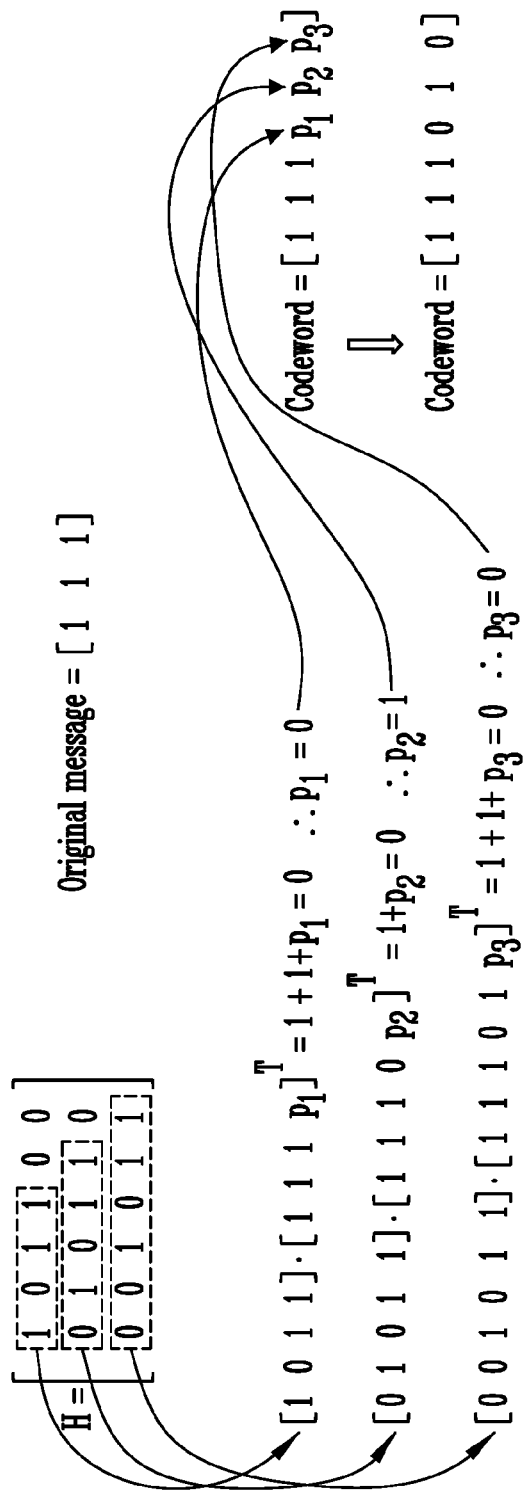
FIG. 9 is a diagram illustrating an example of low-complexity error correction encoding conducted by using a parity check matrix.

FIG. 9 is a diagram illustrating an example of low-complexity error correction encoding conducted by using a parity check matrix based on some embodiments of the disclosed technology.

As shown in FIG. 9, the error correction encoding implemented based on some embodiments of the disclosed technology may be performed using a 3×6 parity check matrix H including a parity area in a dual diagonal structure.

Let an original message on which error correction encoding is to be performed be [1 1 1], and let a codeword to be generated using the parity check matrix H and the original message [1 1 1] be [1 1 1 $p_1$ $p_2$ $p_3$].

A first parity bit $p_1$ may be determined according to Equation (1).

$$[1\ 0\ 1\ 1] \cdot [1\ 1\ 1\ p_1]^T = 0$$

$$1+1+p_1=0$$

$$p_1 = 0 \qquad \text{Eq. (1).}$$

In Equation (1), [1 0 1 1] represents entries corresponding to first to fourth columns among entries included in a first row of the parity check matrix H, and $[1\ 1\ 1\ p_1]^T$ represents a transpose of a vector obtained by combining a first parity bit $p_1$ with the original message. Addition (+) represents modulo-2 addition. The first parity bit $p_1$ may be determined as '0' according to Equation (1).

When the first parity bit ($p_1=0$) is determined, a second parity bit $p_2$ may be determined according to Equation (2).

$$[0\ 1\ 0\ 1\ 1] \cdot [1\ 1\ 1\ 0\ p_2]^T = 0$$

$$1 + p_2 = 0$$

$$p_2 = 1 \qquad \text{Eq. (2).}$$

In Equation (2), [0 1 0 1 1] represents entries corresponding to first to fifth columns among entries included in a second row of the parity check matrix H, and $[1\ 1\ 1\ 0\ p_2]^T$ represents a transpose of a vector obtained by combining the first parity bit ($p_1=0$) and a second parity bit $p_2$ with the original message. The second parity bit $p_2$ may be determined as '1' according to Equation (2).

When the first parity bit ($p_1=0$) and the second parity bit ($p_2=1$) are determined, a third parity bit $p_3$ may be determined according to Equation (3).

$$[0\ 0\ 1\ 0\ 1\ 1] \cdot [1\ 1\ 1\ 0\ 1\ p_3]^T = 0$$

$$1 + 1 + p_3 = 0$$

$$p_3 = 0 \qquad \text{Eq. (3).}$$

In Equation (3), [0 0 1 0 1 1] represents entries corresponding to first to sixth columns among entries included in a third row of the parity check matrix H, and $[1\ 1\ 1\ 0\ 1\ p_3]^T$ represents a transpose of a vector obtained by combining the first parity bit ($p_1=0$), the second parity bit ($p_2=1$), and a third parity bit $p_3$ with the original message. The third parity bit $p_3$ may be determined as '0' according to Equation (3).

Consequently, when the low complexity error correction encoding is performed using the parity check matrix H and the original message [1 1 1], which are shown in FIG. 9, codeword [1 1 1 0 1 0] can be generated.

Figure 10:
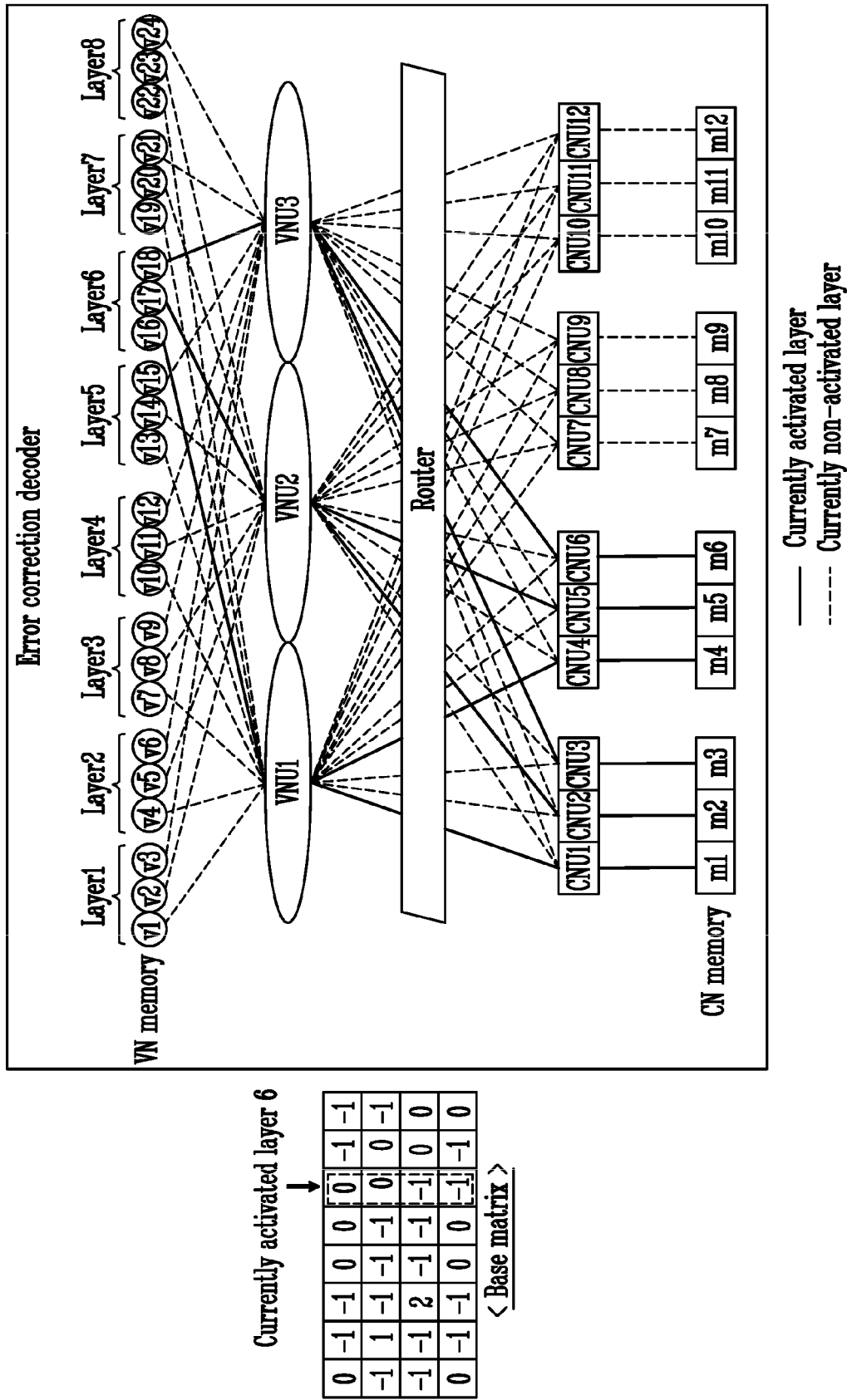
FIG. 10 is a diagram illustrating an example of error correction decoding conducted by using the column-layered scheme based on an embodiment of the disclosed technology.

FIG. 10 is a diagram illustrating an example of error correction decoding conducted by using the column-layered scheme based on an embodiment of the disclosed technology.

In FIG. 10, a base matrix having a size of 4×8 is illustrated. When entries of the base matrix are configured as sub-matrices having a size of 3×3, a parity check matrix corresponding to the base matrix may have a size of 12×24. The relationship between the base matrix and the parity check matrix is the same as described with reference to FIG. 2.

For convenience of description, some of the components of the error correction decoder are illustrated in FIG. 10.

A VN memory may store hard decision values of variable nodes.

Variable node units VNU1 to VNU3 may update the hard decision values of the variable nodes, which are stored in the VN memory and generate V2C messages according to C2V messages received from check node units CNU1 to CNU12, and pass the V2C messages to the check node units CNU1 to CNU12.

A CN memory may store values of check nodes.

The check node units CNU1 to CNU12 may generate C2V messages according to the values of the check nodes, which are stored in the CN memory, and pass the C2V messages to the variable nodes VNU1 to VNU3. The check node units CNU1 to CNU12 may update the values of the check nodes, which are stored in the CN memory, according to the V2C messages received from the variable node units VNU1 to VNU3.

A router may connect the variable node units VNU1 to VNU3 and the check node units CNU1 to CNU12 according to the parity check matrix. For example, the router may connect the variable node units VNU1 to VNU3 and the check node units CNU1 to CNU12, based on information on CPMs belonging to a currently activated layer.

For example, when a CPM having a cyclic shift amount of 0 is included in a first row among rows belonging to the currently activated layer, the router may connect the variable node units VNU1 to VNU3 and check node units CNU1 to CNU3 corresponding to the first row. The router may control the variable node unit VNU1 to be connected to the check node unit CNU1, control the variable node unit VNU2 to be connected to the check node unit CNU2, and control the variable node unit VNU3 to be connected to the check node unit CNU3.

When a CPM having a cyclic shift amount of 1 is included in the first row among the rows belonging to the currently activated layer, the router may control the variable node unit VNU1 to be connected to the check node unit CNU3, control the variable node unit VNU2 to be connected to the check node unit CNU1, and control the variable node unit VNU3 to be connected to the check node unit CNU2.

In the column-layered scheme, a layer corresponding to a sub-iteration may be activated for each sub-iteration. The activated layer may indicate that information exchange is performed between several units included in the error correction decoder so as to update values of variable nodes belonging to the layer and values of check nodes associated with the layer.

For example, when layer 6 among layers Layer 1 to Layer 8 is activated, memory areas m1 to m6, in which values of check nodes associated with the layer 6 are stored, may be accessed by check node units CNU1 to CNU6. In addition, memory areas v16, v17, and v18, in which hard decision values of variable nodes belonging to the layer 6 are stored, may be accessed by the variable node unit VNU1 to VNU3.

In the column-layered scheme, values of all check nodes associated with a layer activated in each sub-iteration may be updated in parallel.

In the example shown in FIG. 10, the check node units CNU1 to CNU12 respectively corresponding to memory areas m1 to m12 exist. Each of the check nodes CNU1 to CNU12 may generate a C2V message or update a value of a check node by always accessing memory areas corresponding thereto among the memory areas m1 to m12.

Figure 11:
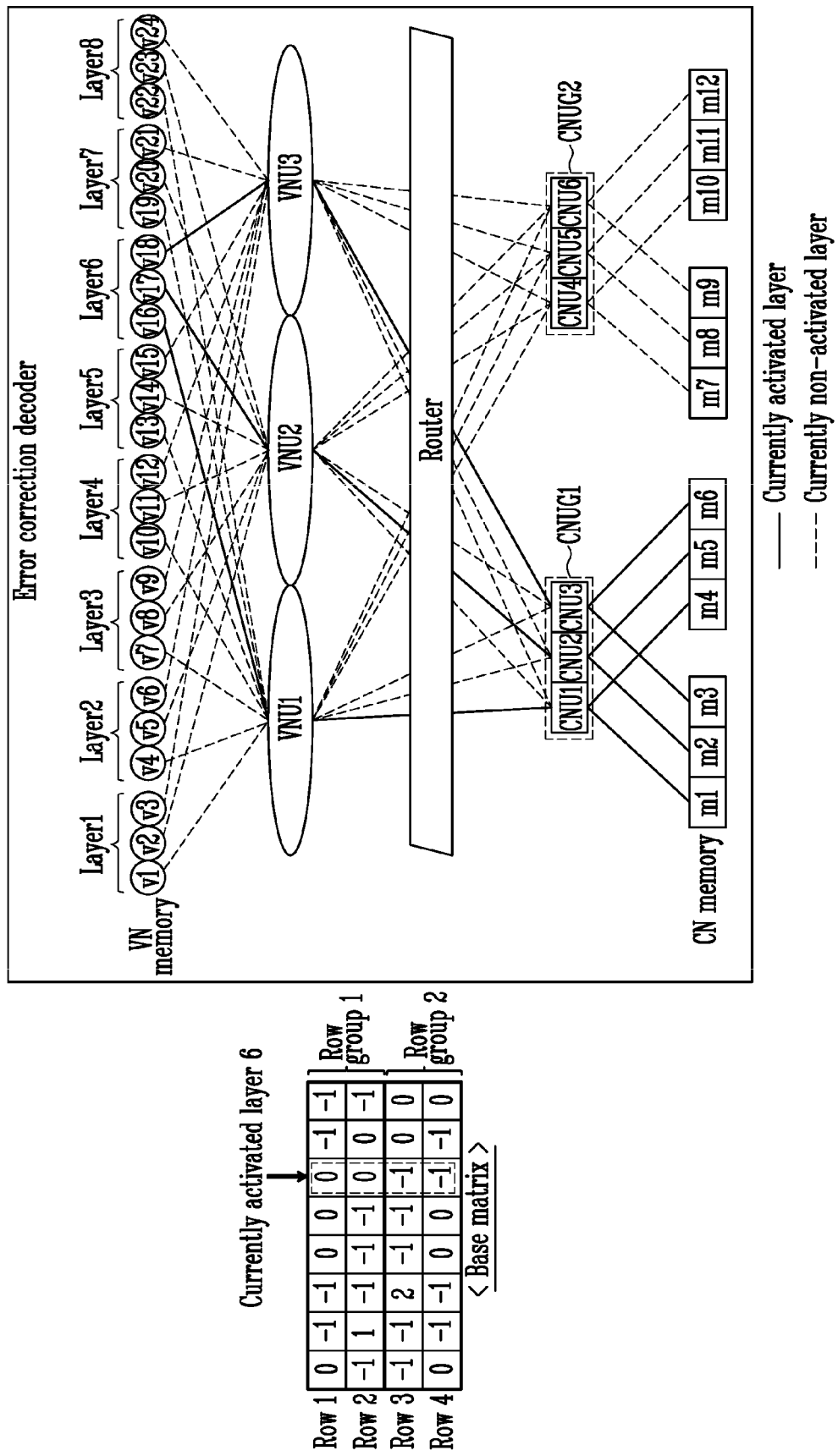
FIG. 11 is a diagram illustrating an example of error correction decoding conducted by using the column-layered scheme based on an embodiment of the disclosed technology.

FIG. 11 is a diagram illustrating an example of error correction decoding performed by using the column-layered scheme based on an embodiment of the disclosed technology.

As shown in FIG. 11, a grouping scheme may be further used. The embodiments described with reference to FIG. 11 may include similar features to the embodiments discussed above. Therefore, repetitive descriptions of these similar features may not be made in some circumstances.

In the example shown in FIG. 11, rows of a base matrix may be grouped into a plurality of row groups. For example, row 1 and row 2 of the base matrix may be grouped as row group 1, and row 3 and row 4 of the base matrix may be grouped as a row group 2.

When error correction decoding is performed by grouping the rows of the base matrix, hardware resources can be saved. For example, in the example shown in FIG. 11, the error correction decoder may include check node unit groups CNUG1 and CNUG2 corresponding to the number of the row groups row group 1 and row group 2. Check node unit group 1 CNUG1 corresponds to the row group 1, and check node unit group 2 CNUG2 corresponds to the row group 2. Each of the check node unit groups CNUG1 and CNUG2 may include check node units the number of which corresponds to a size of a sub-matrix. For example, the sub-matrix may be a square matrix, and the size of the sub-matrix may represent the number of rows or columns in the sub-matrix. For example, when the size of the sub-matrix is 3, the check node unit group CNUG1 may include three check node units CNU1 to CNU3, and the check node unit group CNUG2 may include three check node units CNU4 to CNU6.

In the example shown in FIG. 11, the error correction decoder includes six check node units CNU1 to CNU6. That is, when the grouping scheme is further used as shown in FIG. 11, the number of check node units may be decreased in proportion to a number of rows included in each group, as compared with when the grouping scheme is not used as described with reference to FIG. 10. For example, when each row group includes two rows, the number of check node units may be decreased by twice, as compared with when the grouping scheme is not used. When each row group includes five rows, the number of check node units may be decreased by five times, as compared with when the grouping scheme is not used.

Since the number of check node units is decreased when the grouping scheme is used, each check node unit is to access a plurality of memory areas. For example, check node unit CNU1 belonging to the check node unit group CNUG1 corresponding to the row group 1 is to access any one memory area m1 among memory areas m1 to m3 corresponding to the row 1 and any one memory area m4 among memory areas m4 to m6 corresponding to the row 2.

When layer 6 in which two CPMs are included among layers of row group 1 is activated, each of the check node units CNU1 to CNU3 belonging to the check node unit group 1 CNUG1 is to simultaneously access two memory areas. For example, the check node unit CNU1 is to access memory areas m1 and m4, the check node unit CNU2 is to access memory areas m2 and m5, and the check node unit CNU3 is to access memory areas m3 and m6. That is, since each of the check node units CNU1 to CNU3 is to simultaneously access two memory areas, a collision in the process occurs. The collision in the process, however, can be avoided by scheduling an order in which the check node units CNU1 to CNU3 access the memory areas m1 to m6 or adding separate hardware.

Figure 12:
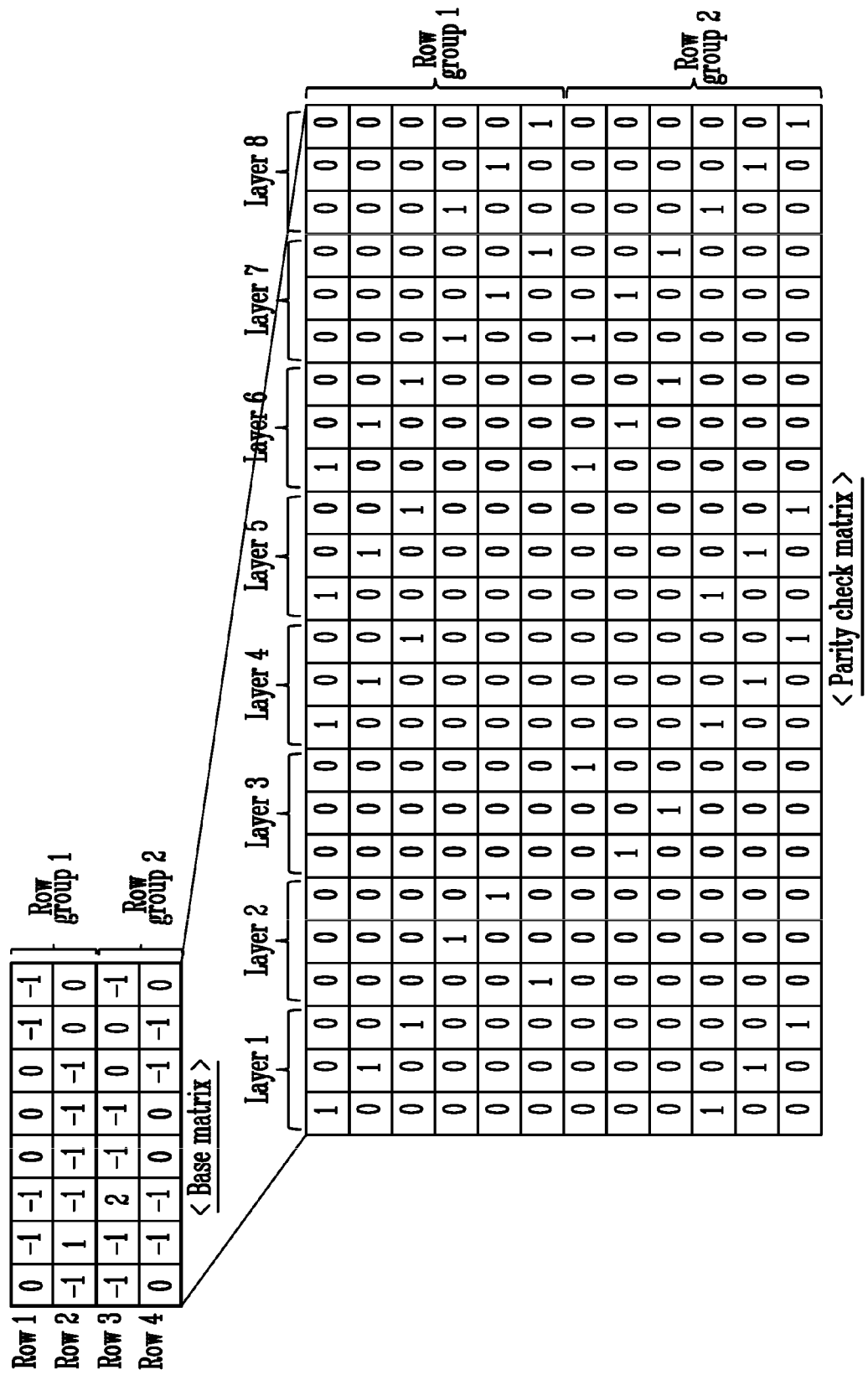
FIG. 12 is a diagram illustrating a parity check matrix based on an embodiment of the disclosed technology.

FIG. 12 is a diagram illustrating a parity check matrix based on an embodiment of the disclosed technology.

In the example shown in FIG. 12, as described with reference to FIG. 2, an entry indicated by '−1' in a base matrix represents that the corresponding entry is a zero matrix, and an entry indicated by '0' in the base matrix represents that the corresponding entry is an identity matrix. In addition, an entry indicated by '1' in the base matrix represents that the corresponding entry is a matrix obtained by performing a cyclic shift to the right on the identify matrix, and an entry indicated by '2' in the base matrix represents that the corresponding entry is a matrix obtained by performing two cyclic shifts to the right on the identify matrix.

The parity check matrix based on some embodiments of the disclosed technology may include at most one CPM for each layer with respect to each row group.

In the example shown in FIG. 12, one CPM is included in each of layer 1, layer 2, layer 4, layer 5, layer 6, layer 7, and layer 8 of row group 1, and any CPM is not included in layer 3 of the row group 1.

In the same example, one CPM is included in each of layer 1, layer 3, layer 4, layer 5, layer 6, layer 7, and layer 8 of row group 2, and any CPM is not included layer 2 of the row group 2.

The parity check matrix shown in FIG. 12 may be generated by permuting some of the rows of the parity check matrix shown in FIG. 2. For example, the base matrix shown in FIG. 12 may be generated by permuting row 2 and row 3 of the base matrix shown in FIG. 2 with each other.

Figure 13:
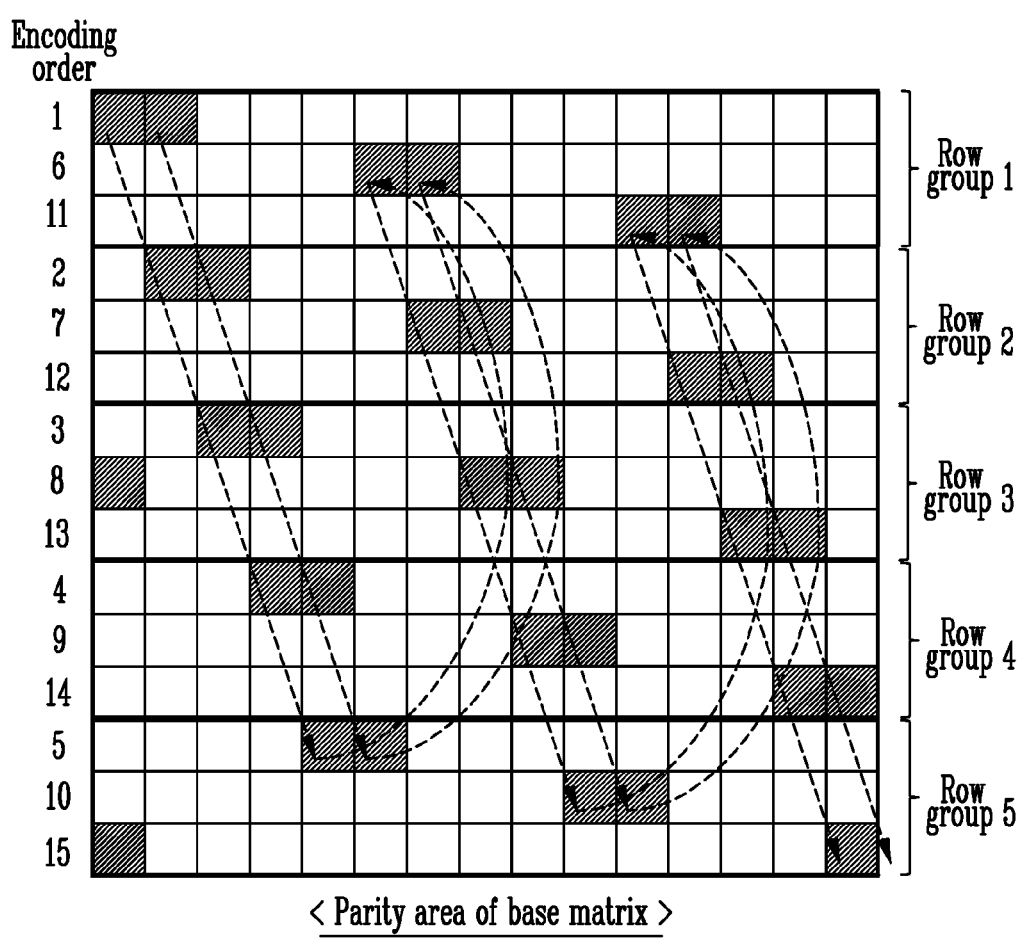
FIG. 13 is a diagram illustrating a parity area of a base matrix based on an embodiment of the disclosed technology.

FIG. 13 is a diagram illustrating a parity area of a base matrix based on an embodiment of the disclosed technology. For convenience of description, entries corresponding to a CPM are indicated by shadow. Entries that are not indicated by shadow represent identity matrices. Shift amounts of all CPMs may be the same, or a shift amount of at least one CPM may be different from those of the other CPMs.

The structure shown in FIG. 13 may be generated by permuting some of rows of a parity area having a dual diagonal structure. Thus, the structure shown in FIG. 13 enables low complexity error correction encoding.

When the structure shown in FIG. 13 is used for the low complexity error correction encoding, an encoding order may be different from that when the dual diagonal structure is used. For example, as described with reference to FIG. 9, when the dual diagonal structure is used for the low complexity error correction encoding, the low complexity error correction encoding may be performed while sequentially selecting rows from the first row to the last row. On the other hand, when the structure shown in FIG. 13 is used for the low complexity error correction encoding, an encoding order may be determined according to the original positions of the permuted rows (i.e., positions on the dual diagonal structure before the permutation is performed).

For example, a first row in the structure shown in FIG. 13 is a row on which the permutation is not performed on the dual diagonal structure. Therefore, the first row may be firstly selected in the low complexity error correction encoding. Meanwhile, a fourth row in the structure shown in FIG. 13 is a row on which a second row was located on the dual diagonal structure. Therefore, the fourth row may be secondly selected in the low complexity error correction encoding. Similarly, a seventh row in the structure shown in FIG. 13 is a row on which a third row was located on the dual diagonal structure. Therefore, the seventh row may be thirdly selected in the low complexity error correction encoding. An encoding order of the other rows may be determined using the same principle. The entire encoding order is illustrated in FIG. 13.

In some implementations, a message area is properly designed after the parity area is designed, so that the entire base matrix can be completed. For example, the base matrix may be designed such that the girth of the base matrix can be maximized by optimizing degree distribution.

In the structure shown in FIG. 13, at most one CPM is included for each layer in each of row groups Row group 1 to Row group 5. This structure enables low complexity decoding when the grouping scheme is used. This will be described in detail with reference to FIG. 14.

Figure 14:
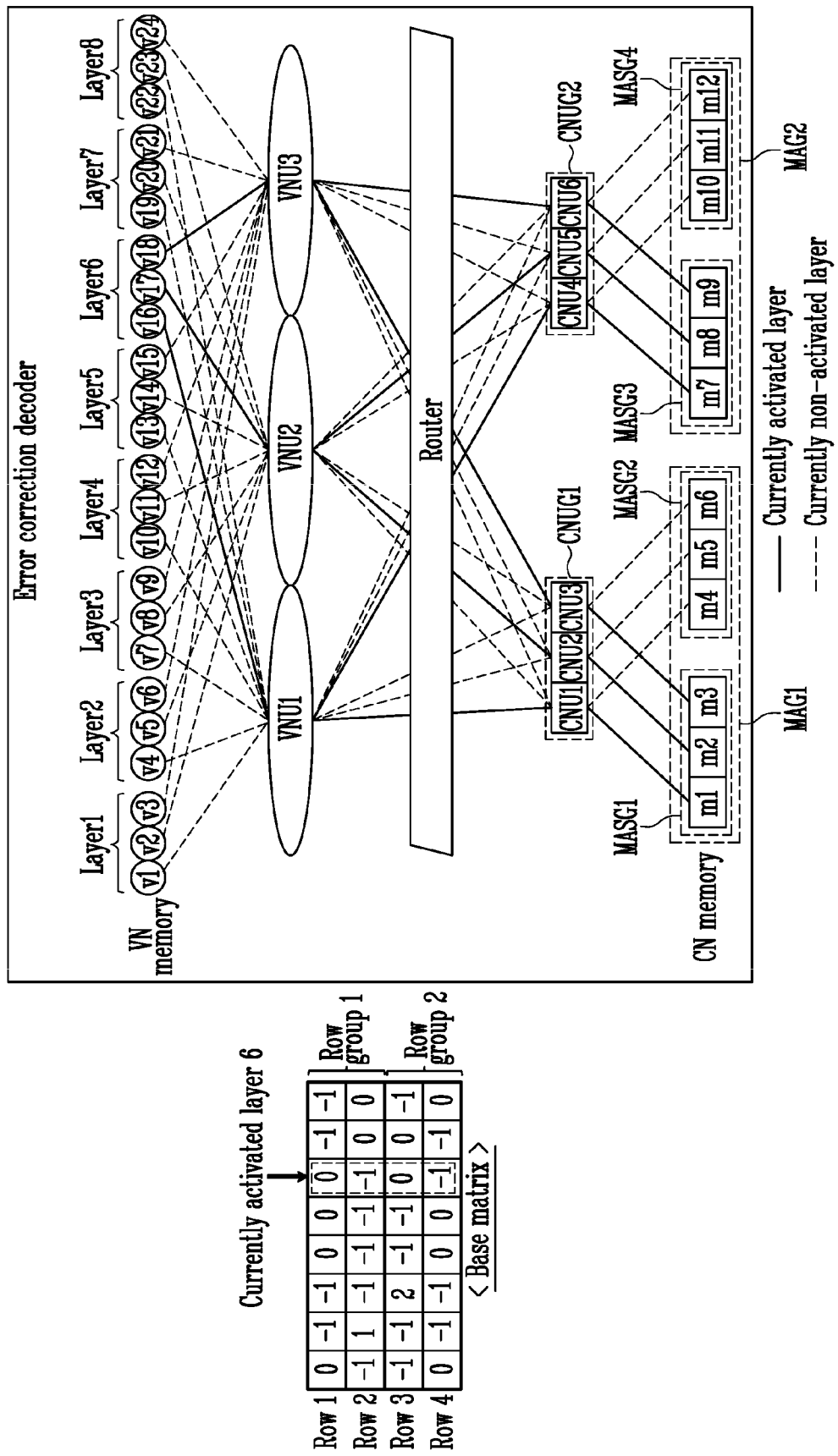
FIG. 14 is a diagram illustrating an example of error correction decoding conducted by using the column-layered scheme based on an embodiment of the disclosed technology.

FIG. 14 is a diagram illustrating an example of error correction decoding performed by using the column-layered scheme based on an embodiment of the disclosed technology.

In the embodiment described with reference to FIG. 14, the base matrix described with reference to FIG. 12 is used to perform error correction decoding. The embodiment described with reference to FIG. 14 may include similar features to the embodiments discussed above. Therefore, repetitive descriptions of these similar features may not be made in some circumstances.

At most one CPM is included for each layer with respect to each row group in the base matrix shown in FIG. 14. This means that, although any layer among layers layer 1 to layer 8 is activated, each of the check node units CNU1 to CNU6 belonging to the check node unit groups CNUG1 and CNUG2 may not access two or more memory areas.

For example, when the layer 6 is activated, each of the check node units CNU1 to CNU6 belonging to the check node unit groups CNUG1 and CNUG2 may access only one memory area. For example, the check node unit CNU1 may access a memory area m1, the check node unit CNU2 may access a memory area m2, the check node unit CNU3 may access a memory area m3, the check node unit CNU4 may access a memory area m7, the check node unit CNU5 may access a memory area m8, and the check node unit CNU6 may access a memory area m9. Therefore, as compared with the embodiment described with reference to FIG. 11, a potential collision in the process may be avoided. That is, only a matrix used for error correction decoding is modified without separate scheduling or addition of hardware, thereby reducing the risk of the collision in the process.

In some implementations, a plurality of memory areas m1 to m12 included in the CN memory may be grouped to correspond to the row groups. For example, the memory areas m1 to m12 may be grouped into a memory area group MAG1 corresponding to the row group 1 and a memory area group MAG2 corresponding to the row group 2.

The check node unit group CNUG1 may update values of check nodes by accessing the memory area group MAG1, and update values of check nodes by accessing the memory area group MAG2.

In some implementations, each of the memory area groups MAG1 and MAG2 may include two or more memory area sub-groups. Each of the memory area sub-groups may include memory areas the number of which corresponds to the size of a sub-matrix. For example, the memory area group MAG1 may include a memory area sub-group MASG1 including three memory areas m1 to m3 and a memory area sub-group MASG2 including three memory areas m4 to m6. Similarly, the memory area group MAG2 may include a memory area sub-group MASG3 including three memory areas m7 to m9 and a memory area sub-group MASG4 including three memory areas m10 to m12.

Each of the check node unit groups CNUG1 and CNUG2 may be accessible to all memory area sub-groups included in a corresponding memory area group. For example, the check node group CNUG1 may be accessible to the memory area sub-groups MASG1 and MASG2, and the check node unit group CNUG2 may be accessible to the memory area sub-groups MASG3 and MASG4. Each of the check node unit groups CNUG1 and CNUG2 may access a memory area sub-group corresponding to a CPM included in a currently activated layer among the accessible memory area sub-groups. In addition, each of the check node unit groups CNUG1 and CNUG2 may update values of check nodes, which are stored in the memory areas included in the accessed memory area sub-group in parallel.

For example, when the layer 6 is activated, the check node unit group CNUG1 may access the memory area sub-group MASG1 corresponding to the row 1, and the check node unit group CNUG2 may access the memory area sub-group MASG3 corresponding to the row 3. Accordingly, values of check nodes, which are stored in the memory areas m1, m2, m3, m7, m8, and m9, can be updated in parallel.

Figure 15:
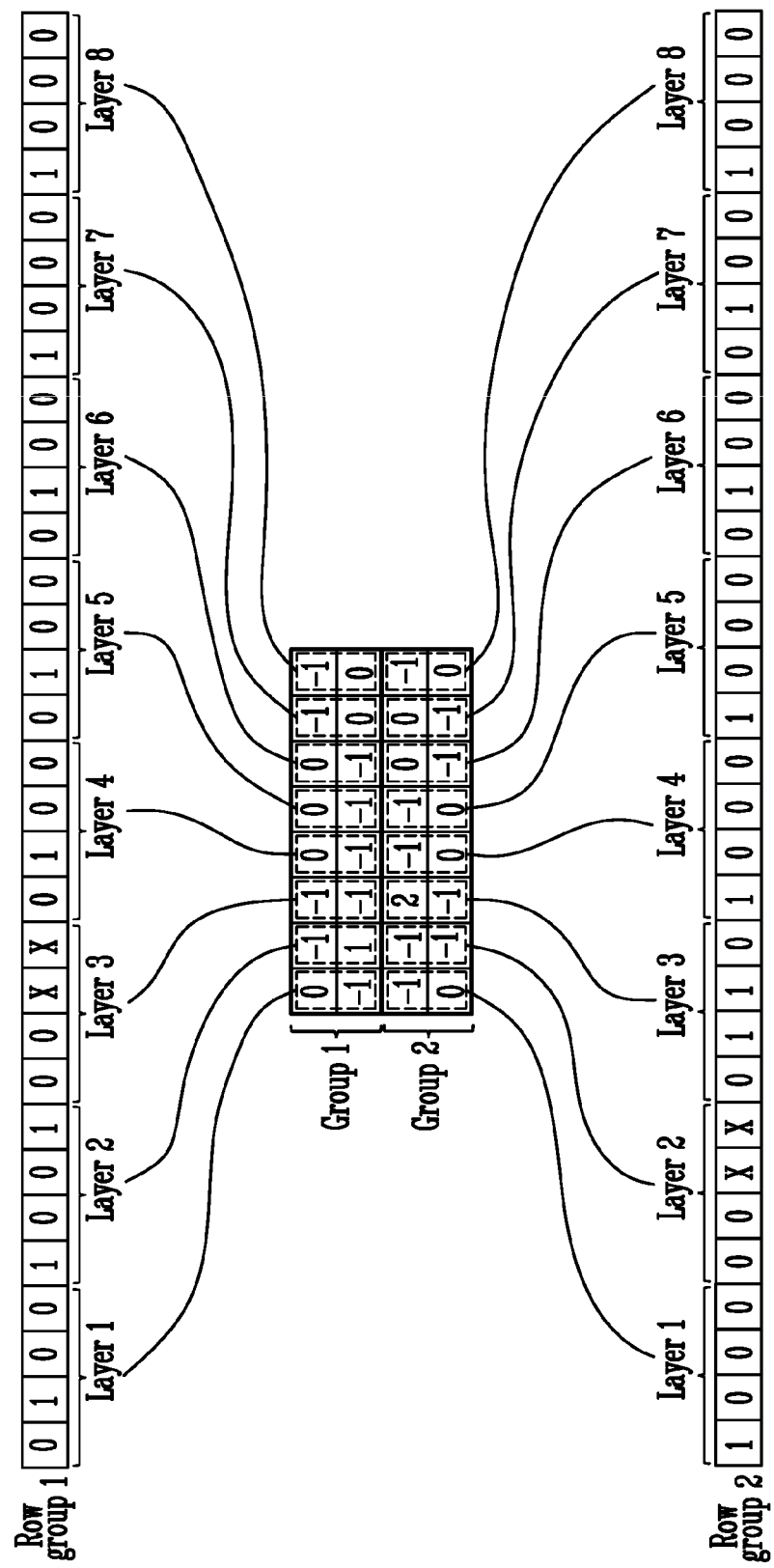
FIG. 15 is a diagram illustrating an example in which a parity check matrix is stored based on an embodiment of the disclosed technology.

FIG. 15 is a diagram illustrating an example in which a parity check matrix is stored based on an embodiment of the disclosed technology.

When a parity check matrix is configured such that at most one CPM is included for each layer with respect to each row group, a memory capacity required to store the parity check matrix may be decreased.

In the example shown in FIG. 15, information of each layer with respect to each of row groups row group 1 and row group 2 is stored using 4 bits. First two bits in the information of 4 bits represent a position (or index) of a row in which the CPM is included, and second two bits in the information of 4 bits represent a cyclic shift amount.

For example, '0100' represents that an identify matrix (i.e., a CPM having a shift amount of 0) exists on a first row of a column layer belonging to a row group, '0110' represents that a CPM obtained by performing two cyclic shifts on the identity matrix exists on the first row of the column layer belonging to the row group, '1000' represents that an identity matrix exists on a second row of the column layer belonging to the row group, '1001' represents that a CPM obtained by performing a cyclic shift on the identity matrix exists on the second row of the column layer belonging to the row group, and '00xx' represents that any CPM does not exist in the column layer belonging to the row group. Here, 'xx' may have any value between 00, 01, 10, and 11.

Referring to FIG. 15, since at most one CPM exists for each column layer belonging to each row group, only the position and shift amount of the row in which the CPM is included may be stored, and therefore, the memory capacity required to store the parity check matrix may be decreased.

When two or more CPMs exist for each column layer belonging to each row group, 8 bits may be required. Hence, a memory may be additionally required to store information representing which layer each bit corresponds to.

Figure 16:
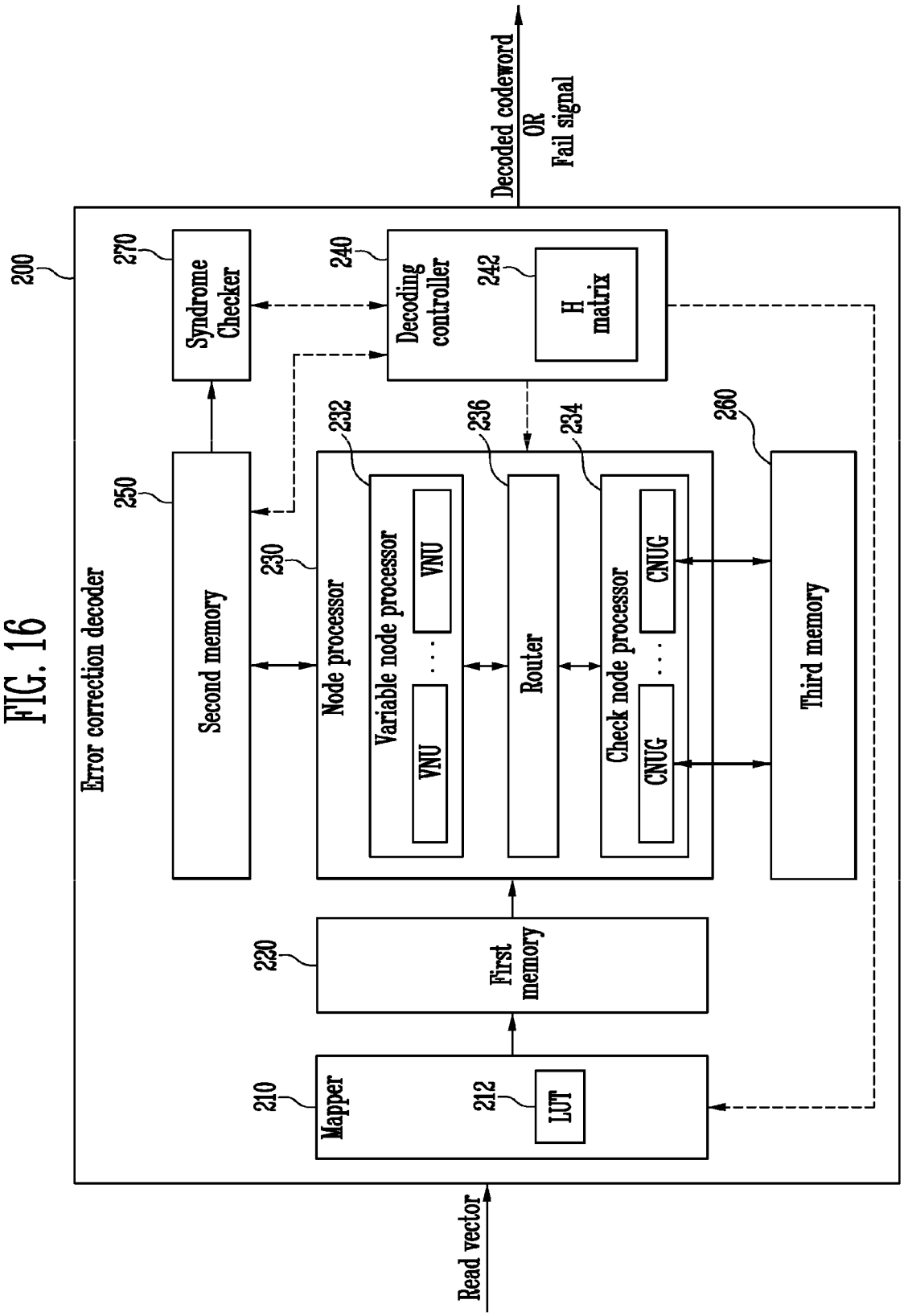
FIG. 16 is a diagram illustrating an error correction decoder based on an embodiment of the disclosed technology.

FIG. 16 is a diagram illustrating an error correction decoder based on an embodiment of the disclosed technology.

In FIG. 16, the error correction decoder shown in FIG. 14 is illustrated in more detail. Referring to FIG. 16, the error correction decoder 200 may include a mapper 210, a first memory 220, a node processor 230, a decoding controller 240, a second memory 250, a third memory 260, and a syndrome checker 270.

The mapper 210 may receive a read vector corresponding to a codeword, and generate an initial vector, based on the received read vector. The initial vector may include initial values respectively corresponding to read values included in the read vector. The initial values may be LLR values including sign bits and magnitude bits. For example, the mapper 210 may convert read values into initial values with reference to a lookup table (LUT) 212. The mapper 210 may store the generated initial vector in the first memory 220. For example, the first memory 220 may be implemented with a static random access memory (SRAM), a dynamic random access memory (DRAM), or the like, but embodiments of the disclosed technology are not limited thereto.

The node processor 230 may perform error correction decoding, based on the initial vector stored in the first memory 220. The node processor 230 may include a variable node processor 232, a check node processor 234, and a router 236.

The router 236 may route messages communicated between the variable node processor 232 and the check node processor 234. For example, the router 236 may receive information on a currently activated layer from the decoding controller 240, and control transmission of V2C messages and C2V messages, based on the received information. The information on the currently activated layer may include, for example, information on positions and cyclic shift amounts of CPMs included in the currently activated layer. For example, the router 236 may connect variable node units VNU and check node unit groups CNUG, based on the information on the currently activated layer.

In a first iteration, the variable node processor 232 may receive an initial vector from the first memory 220, and store hard decision values corresponding to the received initial vector in the second memory 250. For example, the variable node processor 232 may store, in the second memory 250, a sequence of magnitude bits among sign bits and the magnitude bits, which are included in the initial vector. The variable node processor 232 may generate V2C messages corresponding to layers sequentially activated in the first iteration, based on the initial vector received from the first memory 220, and transmit the generated V2C messages to the check node processor 234.

In the first iteration, the check node processor 234 may update values of check nodes, which are stored in the third memory 260, by using the V2C messages received from the variable node processor 232. The check node processor 234 may include check node unit groups CNUG the number of which corresponds to that of row groups. The check node unit groups CNUG may access memory areas corresponding to the CPM included in the currently activated layer among a plurality of memory areas included in the third memory 260, based on the information on the currently activated layer, which is received from the decoding controller 240, and update values of check nodes stored in the accessed memory areas. For example, when the min-sum algorithm is used, the values of the check nodes may include a minimum value among the V2C messages, a second minimum value among the V2C messages, an index of a variable node corresponding to the minimum value, and an index of a variable node corresponding to the second minimum value.

In an iteration subsequent to the first iteration, the check node processor 234 may access memory areas corresponding to the currently activated layer among the plurality of memory areas included in the third memory 260, based on the information on the currently activated layer, generate C2V messages, based on values of check nodes, which are stored in the accessed memory areas, and transmit the generated C2V messages to the variable node processor 232.

In the iteration subsequent to the first iteration, the variable node processor 232 may calculate hard decision values of variable nodes belonging to the currently activated layer, based on the C2V messages received from the check node processor 234 and the initial values stored in the first memory 220, and update the hard decision values of the variable nodes, which are stored in the second memory 250. Also, the variable node processor 232 may generate V2C messages, based on the C2V messages received from the check node processor 234 and the initial values stored in the first memory 220, and transmit the generated V2C messages to the check node processor 234.

The decoding controller 240 may control the mapper 210 to receive read values corresponding to a codeword and generate initial values, based on the received read values.

The decoding controller 240 may control the node processor 230 such that error correction decoding can be performed using the initial values stored in the first memory 220.

The decoding controller 240 may provide the node processor 230 with information on a currently activated layer for each sub-iteration. The information on the currently activated layer may include a position and a cyclic shift amount of a CPM included in the currently activated layer.

When the decoding controller 240 receives a notification that a syndrome vector has passed a syndrome check within a maximum number of iterations I, the decoding controller 240 may control the second memory 250 such that the hard decision values of the variable nodes, which are stored in the second memory 250, can be output as a decoded codeword. When the decoding controller 240 receives a notification that the syndrome vector has failed to pass the syndrome check within the maximum number of iterations I, the decoding controller 240 may control the node processor 230 such that a next iteration can be performed. When the decoding controller 240 does not receive the notification that the syndrome check has succeeded until the maximum number of iterations I, the decoding controller 240 may output a "fail" signal representing that error correction decoding corresponding to a current read vector has failed.

The syndrome checker 270 may perform a syndrome check for each iteration by using a parity check matrix and the hard decision values of the variable nodes, which are stored in the second memory 250. The syndrome checker 270 may notify the decoding controller 240 of whether the syndrome check has been succeeded/failed.

Figure 17:
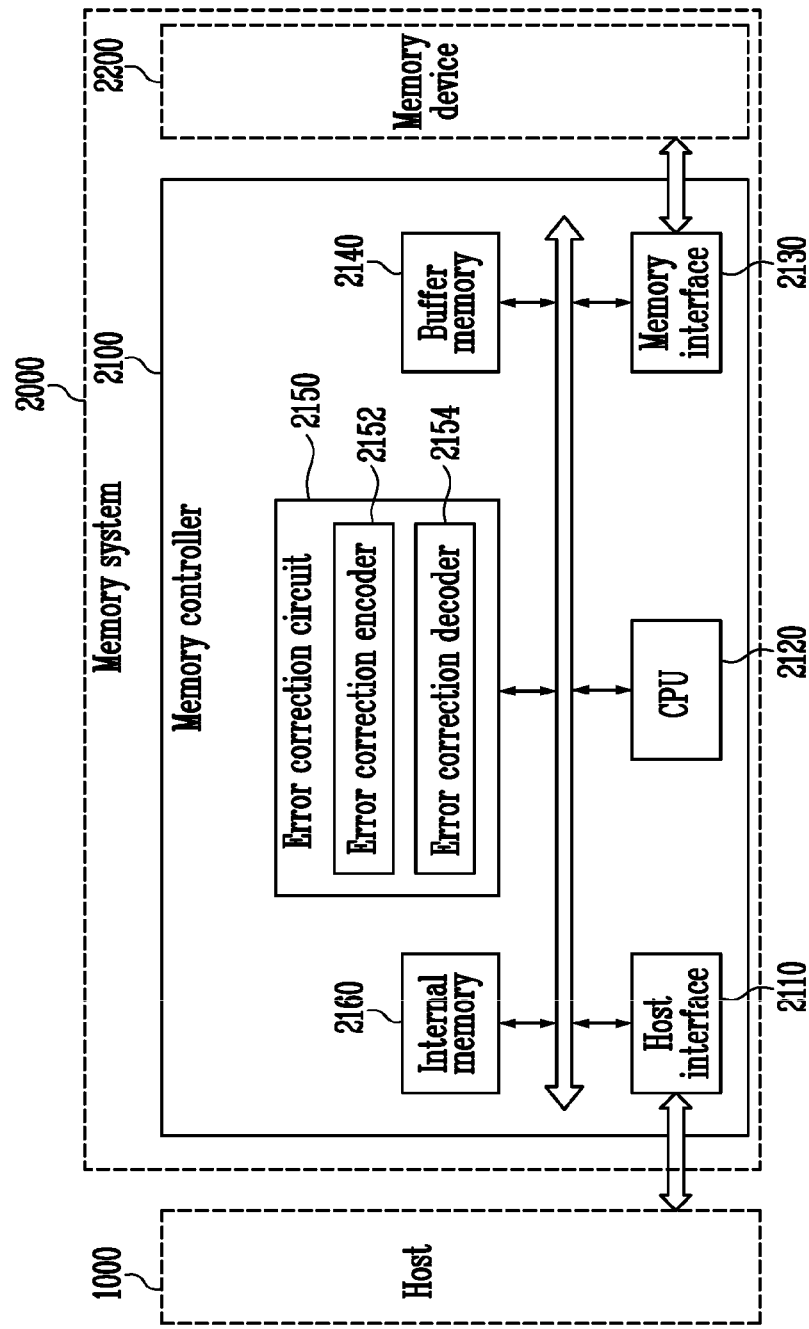
FIG. 17 is a diagram illustrating a memory system based on an embodiment of the disclosed technology.

FIG. 17 is a diagram illustrating a memory system based on an embodiment of the disclosed technology.

Referring to FIG. 17, the memory system 2000 may include a memory device 2200 configured to store data and a memory controller 2100 configured to control the memory device 2200 in response to a request from a host 1000.

The host 1000 may be a device or system configured to store data in the memory system 2000 or retrieve data from the memory system 2000. By way of example and not by limitation, the host 1000 may include at least one of a computer, a portable digital device, a tablet, a digital camera, a digital audio player, a television, a wireless communication device, or a cellular phone.

The memory controller 2100 may control overall operations of the memory system 2000. The memory controller 2100 may perform various operations in response to a request from the host 1000. For example, the memory controller 2100 may perform a program operation, a read operation, and an erase operation on the memory device 2200. In the program operation, the memory controller 2100 may transmit a program command, an address, a codeword, or others to the memory device 2200. In the read operation, the memory controller 2100 may transmit a read command, an address, or others to the memory device 2200, and receive read data corresponding to the codeword from the memory device 2200. In the erase operation, the memory controller 2100 may transmit an erase command, an address, or others to the memory device 2200.

The memory controller 2100 may include a host interface 2110, a central processing unit (CPU) 2120, a memory interface 2130, a buffer memory 2140, an error correction circuit 2150, and an internal memory 2160. The host interface 2110, the memory interface 2130, the buffer memory 2140, the error correction circuit 2150, and the internal memory 2160 may be controlled by the CPU 2120.

The host interface 2110 may transfer a program request, a read request, an erase request, and the like, which are received from the host 1000, to the CPU 2120. In a program operation, the host interface 2110 may receive original data corresponding to the program request from the host 1000, and store the received original data in the buffer memory 2140. In a read operation, the host interface 2110 may transmit a decoded codeword stored in the buffer memory 2140 to the host 1000. The host interface 2110 may perform communication with the host 1000 by using various interface protocols. For example, the host interface 2110 may communicate with the host 1000 by using at least one interface protocol among a Non-Volatile Memory express (NVMe), a Peripheral Component Interconnect-Express (PCI-E), an Advanced Technology Attachment (ATA), a Serial ATA (SATA), a Parallel ATA (PATA), a Universal Serial Bus (USB), a Multi-Media Card (MMC), an Enhanced Small Disk Interface (ESDI), an Integrated Drive Electronics (IDE), a Mobile Industry Processor Interface (MIPI), a Universal Flash Storage (UFS), a Small Computer System Interface (SCSI), and a Serial Attached SCSI (SAS). However, embodiments of the disclosed technology are not limited thereto.

The CPU 2120 may perform various calculations or generate a command and an address so as to control the memory device 2200. For example, the CPU 2120 may generate various commands and addresses necessary for a program operation, a read operation, an erase operation, and the like, in response to a request transferred from the host interface 2110.

When the CPU 2120 receives a program request from the host interface 2110, the CPU 2120 may control the error correction circuit 2150 to perform error correction encoding on original data stored in buffer memory 2140. When the CPU 2120 receives a notification that a codeword has been generated from the error correction circuit 2150, the CPU 2120 may generate a program command and an address, and control the memory interface 2130 such that the generated program command, the generated address, and the codeword stored in the buffer memory 240 can be transmitted to the memory device 2200.

When the CPU 2120 receives a read request from the host interface 2110, the CPU 2120 may generate a read command and an address, and control the memory interface 2130 such that the generated program command and the generated address can be transmitted to the memory device 2200. When the CPU 2120 receives a notification that read data has been received from the memory interface 2130, the CPU 2120 may control the error correction circuit 2150 to perform error correction decoding on the read data stored in the buffer memory 2140. When the CPU 2120 receives a notification that decoded codeword has been generated from the error correction circuit 2150, the CPU 2120 may control the host interface 2110 such that the decoded codeword stored in the buffer memory 2140 can be transmitted to the host 1000.

The memory interface 2130 may perform communication with the memory device 2200 by using various interface protocols.

In a program operation, the memory interface 2130 may transmit, to the memory device 2200, a program command and an address, which are received from the CPU 2120, and a codeword stored in the buffer memory 2140.

In a read operation, the memory interface 2130 may transmit a read command and an address, which are received from the CPU 2120, to the memory device 2200. In the read operation, the memory interface 2130 may store read data received from the memory device 2200 in the buffer memory 2140, and notify the CPU 2120 that the read data has been received.

The buffer memory 2140 may temporarily data while the memory controller 2100 is controlling the memory device 2200.

In a program operation, the buffer memory 2140 may store original data received from the host interface 2110, and transmit the stored original data to the error correction circuit 2150. In the program operation, the buffer memory 2140 may store a codeword received from the error correction circuit 2150, and transmit the stored codeword to the memory interface 2130.

In a read operation, the buffer memory 2140 may store read data receive from the memory device 2200, and transmit the stored read data to the error correction circuit 2150. In the read operation, the buffer memory 2140 may store a decoded codeword received from the error correction circuit 2150, and transmit the stored decoded codeword to the host interface 2110.

The error correction circuit 2150 may perform error correction encoding on original data, and perform error correction decoding on read data. The error correction circuit 2150 may have error correction capability of a certain level. For example, when error bits of which number does not exceed the error correction capability exist in read data, the error correction circuit 2150 may detect and correct an error included in the read data. The maximum error bit count that does not exceed the error correction capability of the error correction circuit 2150 may be referred to as a maximum allowable error bit count. By way of example and not by limitation, the error correction circuit 2150 may be an error correction circuit using an LDPC code, particularly, a QC-LDPC code.

The error correction circuit 2150 may include an error correction encoder 2152 and an error correction decoder 2154.

The error correction encoder 2152 may generate a codeword by performing error correction encoding on original data received from the buffer memory 2140. The error correction encoder 2152 may transmit the generated codeword to the buffer memory 2140, and notify the CPU 2120 that the codeword has been generated. A basic configuration and a basic operation of the error correction encoder 2152 are the same as the error correction encoder 100 described with reference to FIG. 1.

The error correction decoder 2154 may generate a decoded codeword by performing error correction decoding on read data received from the buffer memory 2140. The error correction decoder 2154 may transmit the decoded codeword to the buffer memory 2140, and notify the CPU 2120 that the decoded codeword has been generated. When an error included in the read data is uncorrectable, the error correction decoder 2154 may notify the CPU 2120 that the error correction decoding has failed. A basic configuration and a basic operation of the error correction decoder 2154 are the same as the error correction decoder 200 described with reference to FIGS. 1 and 16.

The error correction encoder 2152 and the error correction decoder 2154 may perform error correction encoding and error correction decoding by using the same parity check matrix. For example, the error correction encoder 2152 and the error correction decoder 2154 may perform low complexity error correction encoding and low complexity error correction decoding by using the parity check matrix (or base matrix) described with reference to FIGS. 12 to 14.

The internal memory 2160 may be used as a storage that stores various information necessary for an operation of the memory controller 2100. The internal memory 2160 may store a plurality of tables. In an embodiment, the internal memory 2160 may store an address mapping table in which logical and physical addresses are mapped.

The memory device 2200 may perform a program operation, a read operation, an erase operation, and the like under the control of the memory controller 2100. The memory device 2200 may be implemented with a volatile memory device in which stored data disappears when the supply of power is interrupted or a nonvolatile memory in which stored data is retained even when the supply of power is interrupted.

The memory device 2200 may receive a program command, an address, and a codeword from the memory controller 2100, and store the codeword, based on the received program command and the received address.

The memory device 2200 may perform a read operation on a codeword, based on the read command and the address, which are received from the memory controller 2100, and provide read data to the memory controller 2100.

Figure 18:
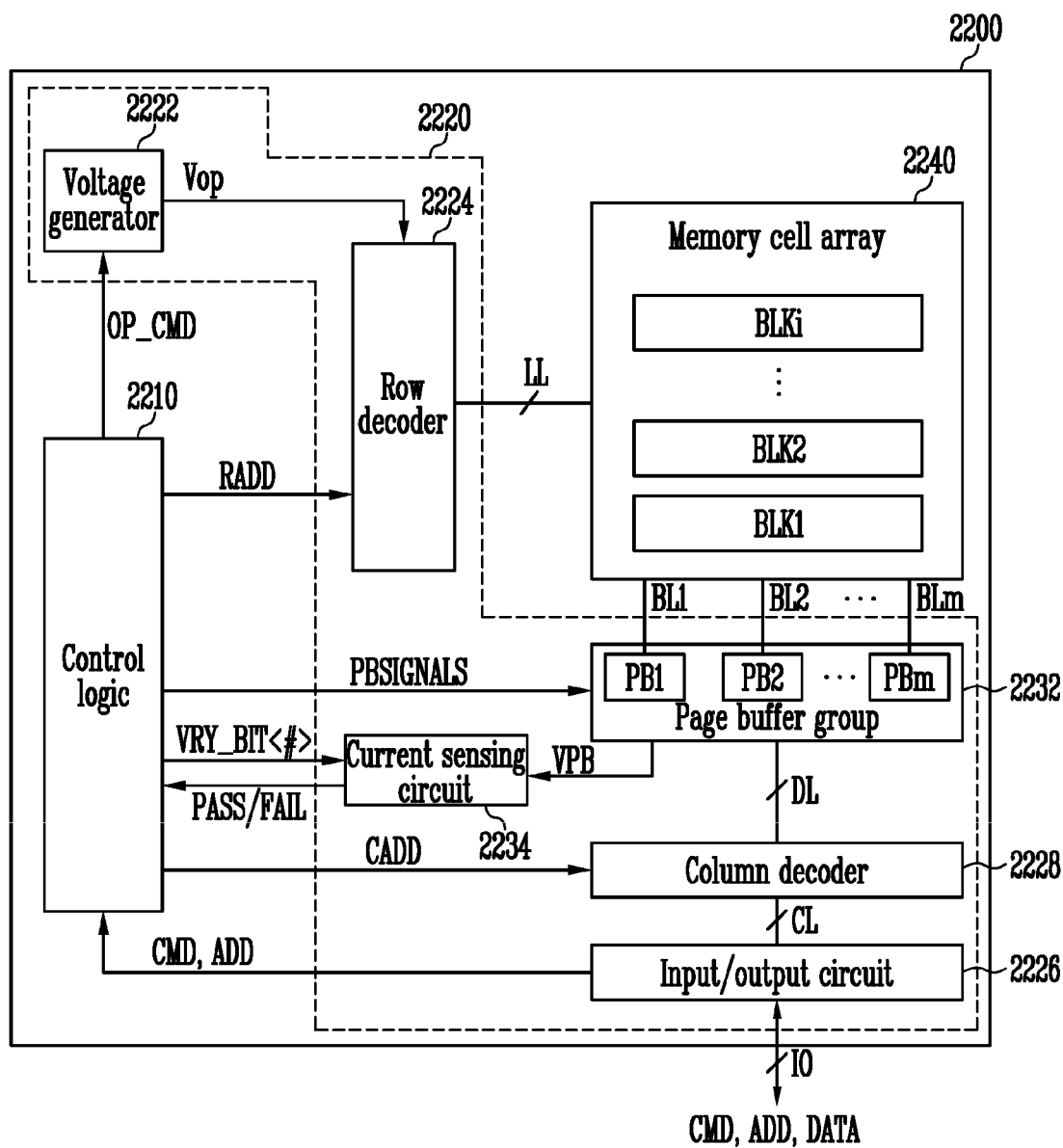
FIG. 18 is a diagram illustrating an example of a memory device based on an embodiment of the disclosed technology.

FIG. 18 is a diagram illustrating a memory device based on an embodiment of the disclosed technology. The memory device shown in FIG. 18 may be applied to the memory system shown in FIG. 17.

The memory device 2200 may include a control logic 2210, peripheral circuits 2220, and a memory cell array 2240. The peripheral circuits 2220 may include a voltage generator 2222, a row decoder 2224, the input/output circuit 2226, a column decoder 2228, a page buffer group 2232, and the current sensing circuit 2234.

The control logic 2210 may control the peripheral circuits 2220 under the control of the memory controller 2100 shown in FIG. 17.

The control logic 2210 may control the peripheral circuits 2220 in response to a command CMD and an address ADD, which are received from the memory controller 2100 through an input/output circuit 2226. For example, the control logic 2210 may output an operation signal OP_CMD, a row address RADD, a column address CADD, page buffer control signals PBSIGNALS, and an allow bit VRY_BIT<#> in response to the command CMD and the address ADD. The control logic 2210 may determine whether a verify operation has passed or failed in response to a pass or fail signal PASS or FAIL received from a current sensing circuit 2234.

The peripheral circuits 2220 may perform a program operation for storing data in the memory cell array 2240, a read operation for outputting data stored in the memory cell array 2240, and an erase operation for erasing data stored in the memory cell array 2240.

The voltage generator 2222 may generate various operating voltages Vop used in program, read, and erase operations in response to the operation signal OP_CMD received from the control logic 2210. For example, the voltage generator 2222 may transfer a program voltage, a verify voltage, a pass voltage, a read voltage, an erase voltage, a turn-on voltage, and the like to the row decoder 2224.

The row decoder 2224 may transfer the operating voltages Vop to local lines LL connected to a selected memory block among memory blocks of the memory cell array 2240 in response to the row address RADD received from the control logic 2210. The local lines LL may include local word lines, local drain select lines, and local source select lines. In addition, the local lines LL may include various lines such as a source line, which are connected to the memory block.

The input/output circuit 2226 may transfer the command CMD and the address ADD, which are received from the memory controller 2100, to the control logic 2210 through input/output lines IO, or exchange data DATA with the column decoder 2228.

The column decoder 2228 may transfer data between the input/output circuit 2226 and the page buffer group 2232 in response to a column address CADD received from the control logic 2210. For example, the column decoder 2228 may exchange data with page buffers PB1 to PBm through data lines DL, or exchange data with the input/output circuit 2226 through column lines CL.

The page buffer group 2232 may be connected to bit lines BL1 to BLm commonly connected to memory blocks BLK1 to BLKi. The page buffer group 2232 may include a plurality of page buffers PB1 to PBm connected to the bit lines BL1 to BLm. For example, one page buffer may be connected to each of the bit lines. The page buffers PB1 to PBm may operate in response to the page buffer control signals PBSIGNALS received from the control logic 2210. For example, in a program operation, the page buffers PB1 to PBm may temporarily store program data received from the memory controller 2100, and adjust a voltage applied to the bit lines BL1 to BLm according to the program data. Also, in a read operation, the page buffers PB1 to PBm may temporarily store data received through the bit lines BL1 to BLm, or sense a voltage or current of the bit lines BL1 to BLm.

During a read or verify operation, the current sensing circuit 2234 may generate a reference current in response to the allow bit VRY_BIT<#> received from the control logic 2210, and output a pass signal PASS or a fail signal PASS or FAIL by comparing a sensing voltage VPB received from the page buffer group 2232 with a reference voltage generated by the reference current.

The memory cell array 2240 may include a plurality of memory blocks BLK1 to BLKi in which data is stored. User data and various information required to perform an operation of the memory device 2200 may be stored in the memory blocks BLK1 to BLKi. The memory blocks BLK1 to BLKi may be implemented in a two-dimensional structure or a three-dimensional structure, and be configured identical to one another.

Figure 19:
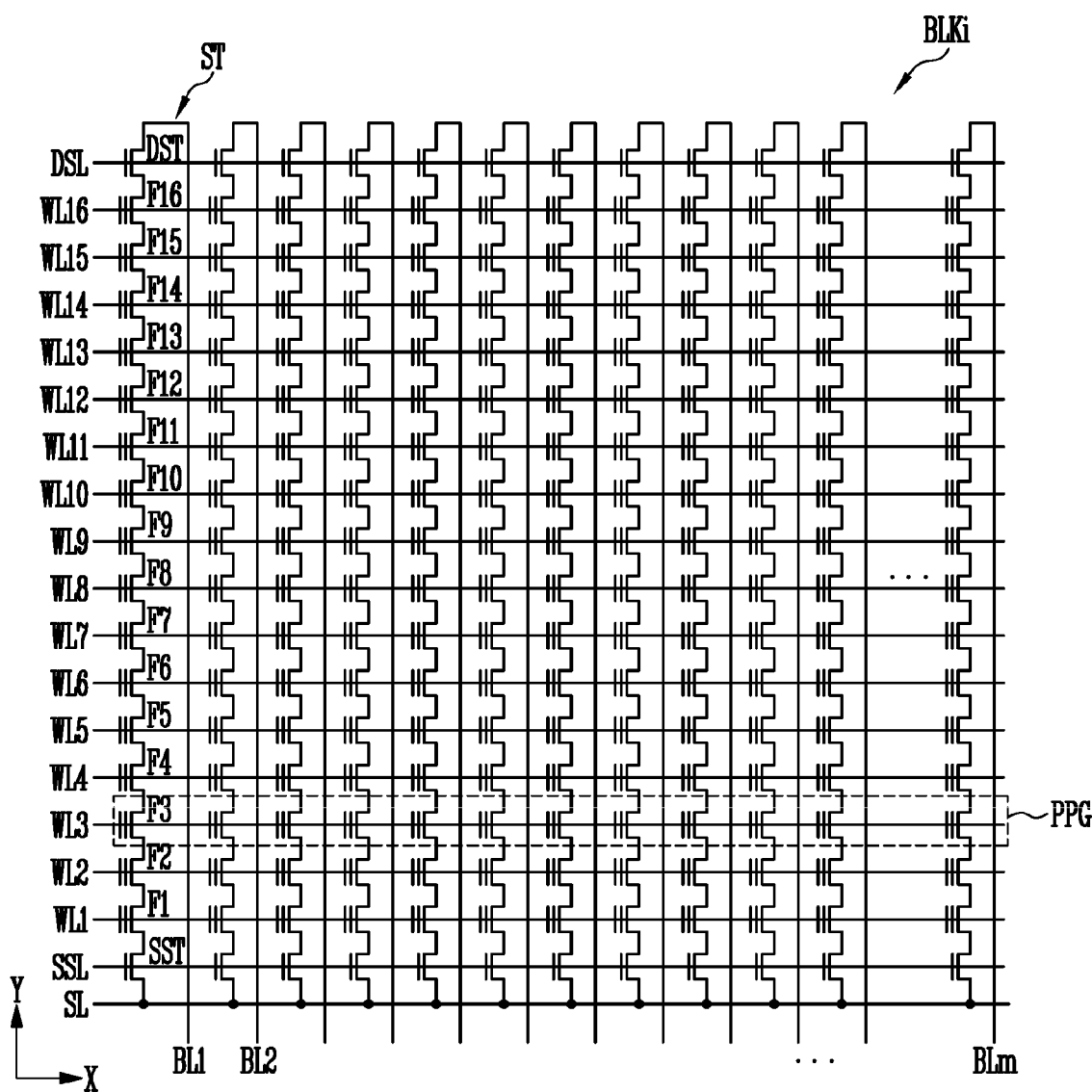
FIG. 19 is a diagram illustrating an example of a memory block.

FIG. 19 is a diagram illustrating a memory block.

A memory cell array may include a plurality of memory blocks. For convenience of description any one memory block BLKi among the plurality of memory blocks is illustrated in FIG. 19.

In the memory block BLKi, a plurality of word lines arranged in parallel to one another may be connected between a first select line and a second select line. The first select line may be a source select line SSL, and the second select line may be a drain select line DSL. Specifically, the memory block BLKi may include a plurality of strings ST connected between bit lines BL1 to BLm and a source line SL. The bit lines BL1 to BLm may be connected to the strings ST, respectively, and the source line SL may be commonly connected to the strings ST. The strings ST may be configured identically to one another, and therefore, a string ST connected to a first bit line BL1 will be described in detail as an example.

The string ST may include a source select transistor SST, a plurality of memory cells F1 to F16, and a drain select transistor DST, which are connected in series to each other between the source line SL and the first bit line BL1. At least one source select transistor SST and at least one drain select transistor DST may be included in one string ST, and memory cells of which number is larger than that of the memory cells F1 to F16 shown in the drawing may be included in one string ST.

A source of the source select transistor SST may be connected to the source line SL, and a drain of the drain select transistor DST may be connected to the first bit line BL1. The memory cells F1 to F16 may be connected in series between the source select transistor SST and the drain select transistor DST. Gates of source select transistors SST included in different strings ST may be connected to the source select line SSL, gates of drain select transistors DST included in different strings ST may be connected to the drain select line DSL, gates of the memory cells F1 to F16 included in different strings ST may be connected to a plurality of word lines WL1 to WL16. A group of memory cells connected to the same word line among the memory cells included in different strings ST may be a physical page PPG Therefore, physical pages PPG of which number corresponds to that of the word lines WL1 to WL16 may be included in the memory block BLKi.

One memory cell may store one-bit data. The memory cell is referred to as a single level cell (SLC). One physical page PPG may store one logical page (LPG) data. One LPG data may include data bits of which number corresponds to that of cells included in one physical page PPG. For example, when two or more-bit data is stored in one memory cell, one physical page PPG may store two or more LPG data. For example, in a memory device driven in a 2-bit MLC type, two LPG data may be stored in one physical page PPG In a memory device driven in a 3-bit MLC (triple level cell; TLC) type, three LPG data may be stored in one physical page PPG.

Figure 20:
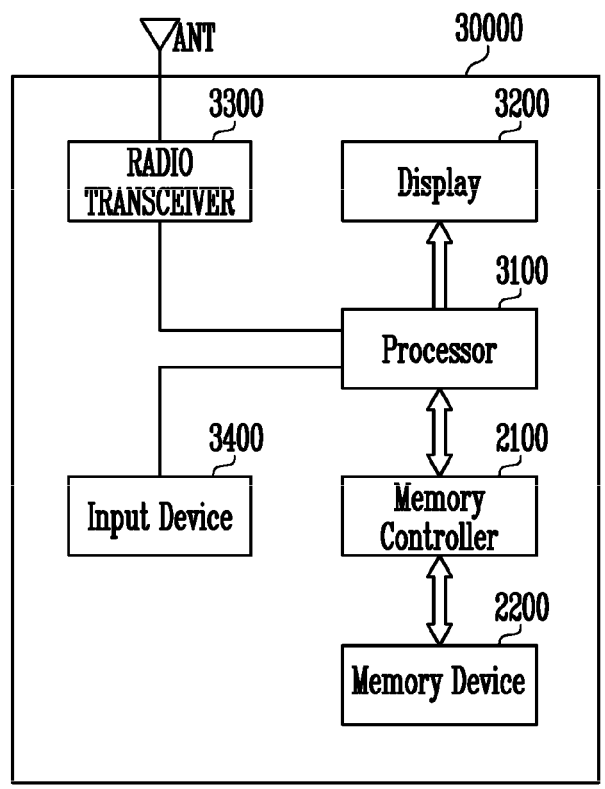
FIG. 20 is a diagram illustrating another example of the memory system including a memory controller shown in FIG. 17.

FIG. 20 is a diagram illustrating another example of the memory system including the memory controller shown in FIG. 17.

Referring to FIG. 20, the memory system 30000 may be implemented as a cellular phone, a smart phone, a tablet PC, a personal digital assistant (PDA), or a wireless communication device. The memory system 30000 may include a memory device 2200 and a memory controller 2100 capable of controlling an operation of the memory device 2200.

The memory controller 2100 may control a data access operation of the memory device 2200, e.g., a program operation, an erase operation, a read operation, or the like under the control of a processor 3100.

Data programmed in the memory device 2200 may be output through a display 3200 under the control of the memory controller 2100.

A radio transceiver 3300 may transmit/receive radio signals through an antenna ANT. For example, the radio transceiver 3300 may change a radio signal received through the antenna ANT into a signal that can be processed by the processor 3100. Therefore, the processor 3100 may process a signal output from the radio transceiver 3300 and transmit the processed signal to the memory controller 2100 or the display 3200. The memory controller 2100 may transmit the signal processed by the processor 3100 to the memory device 2200. Also, the radio transceiver 3300 may change a signal output from the processor 3100 into a radio signal, and output the changed radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 2100, data output from the radio transceiver 3300, or data output from the input device 3400 can be output through the display 3200.

In some embodiments, the memory controller 2100 capable of controlling an operation of the memory device 2200 may be implemented as a part of the processor 3100, or be implemented as a chip separate from the processor 3100.

Figure 21:
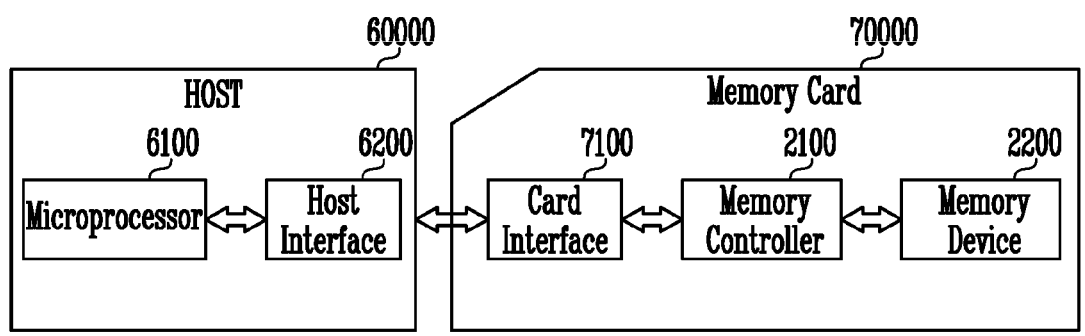
FIG. 21 is a diagram illustrating another example of the memory system including a memory controller shown in FIG. 17.

FIG. 21 is a diagram illustrating another example of the memory system including the memory controller shown in FIG. 17.

Referring to FIG. 21, the memory system 70000 may be implemented as a memory card or a smart card. The memory system 70000 may include a memory device 2200, a memory controller 2100, and a card interface 7100.

The memory controller 2100 may control data exchange between the memory device 2200 and the card interface 7100. In some embodiments, the card interface 7100 may be a Secure Digital (SD) card interface or a Multi-Media Card (MMC) interface, but the disclosed technology is not limited thereto.

The card interface 7100 may interface data exchange between a host 60000 and the memory controller 2100 according to a protocol of the host 60000. In some embodiments, the card interface 7100 may support a Universal Serial Bus (USB) protocol and an Inter-Chip (IC)-USB protocol. The card interface 7100 may mean hardware capable of supporting a protocol used by the host 60000, software embedded in the hardware, or a signal transmission scheme.

When the memory system 70000 is connected to a host interface 6200 of the host 60000 such as a PC, a tablet PC, a digital camera, a digital audio player, a cellular phone, console video game hardware, or a digital set-top box, the host interface 6200 may perform data communication with the memory device 2200 through the card interface 7100 and the memory controller 2100 under the control of a microprocessor 6100.

By implementing the technology disclosed in the present disclosure, low complexity error correction encoding and low complexity error correction decoding can be achieved.

By implementing the technology disclosed in the present disclosure, a parity check matrix that enables both the low complexity error correction encoding and the low complexity error correction decoding can be provided.

What is claimed is:

1. An error correction circuit, comprising:
   an error correction decoder configured to perform error correction decoding on a read vector on a column layer basis while sequentially selecting column layers of a parity check matrix including a plurality of sub-matrices, wherein the column layer includes a set of columns of the parity check matrix, and
   wherein the error correction decoder includes:
   a plurality of memory areas configured to store values of a plurality of check nodes corresponding to the parity check matrix; and
   a check node processor including a plurality of check node units and configured to access one or more of the plurality of memory areas corresponding to cyclic permutation matrices (CPMs) included in a currently selected column layer, and update values of check nodes stored in the accessed one or more memory areas,
   wherein rows included in the parity check matrix are grouped into a plurality of row groups, and at most one CPM is included for each column layer in each of the row groups, and
   wherein the plurality of check node units for the currently selected column layer does not access two or more memory areas.

2. The error correction circuit of claim 1, wherein the memory areas are grouped into a plurality of memory area groups corresponding to each of the row groups, and wherein the check node processor includes a plurality of check node unit groups each configured to access a corresponding memory area group among the plurality of memory area groups and update values of check nodes stored in the accessed memory area group.

3. The error correction circuit of claim 2, wherein each of the plurality of memory area groups include two or more memory area sub-groups, and a number of memory areas included in each of memory area sub-groups is determined based on a size of each of the sub-matrices,
   wherein each of the check node unit groups is accessible to the two or more memory area sub-groups included in a corresponding memory area group among the memory area groups.

4. The error correction circuit of claim 3, wherein each of the check node unit groups is configured to access a memory area sub-group corresponding to a first CPM included in the currently selected column layer among the accessible two or more memory area sub-groups.

5. The error correction circuit of claim 4, wherein each of the check node unit groups includes check node units, a number of the check node units being determined based on the size of each of the sub-matrices,
   wherein each of the check node units is accessible to any one memory area among memory areas included in a corresponding memory area sub-group with respect to each of the two or more memory area sub-groups.

6. The error correction circuit of claim 2, wherein a number of the check node unit groups matches a number of the row groups.

7. The error correction circuit of claim 2, wherein the check node unit groups update values of check nodes corresponding to a cyclic permutation matrix (CPM) included in the currently selected column layer in parallel.

8. The error correction circuit of claim 1, further comprising an error correction encoder configured to perform error correction encoding by using the parity check matrix used for the error correction decoding.

9. A memory controller comprising:
   an error correction encoder configured to generate a codeword by performing error correction encoding, using a parity check matrix including a plurality of sub-matrices; and
   an error correction decoder configured to perform error correction decoding on a read vector corresponding to the codeword on a column layer basis while sequentially selecting column layers of the parity check matrix used for the error correction encoding, in the error correction decoding, wherein the column layer includes a set of columns of the parity check matrix,
   wherein rows included in the parity check matrix are grouped into a plurality of row groups, and at most one cyclic permutation matrix (CPM) is included for each column layer in each of the row groups, and
   wherein the error correction decoder includes a plurality of check node units, and the plurality of check node units for a currently selected column layer does not access two or more memory areas.

10. The memory controller of claim 9, wherein the error correction decoder includes:
   a plurality of memory areas configured to store values of a plurality of check nodes corresponding to the parity check matrix; and
   a check node processor configured to access one or more of the plurality of memory areas corresponding to cyclic permutation matrices (CPMs) included in the currently selected column layer, and update values of check nodes stored in the accessed memory areas.

11. The memory controller of claim 10, wherein the memory areas are grouped into a plurality of memory area groups corresponding to each of the row groups,
   wherein the check node processor includes a plurality of check node unit groups each configured to access a corresponding memory area group among the plurality of memory area groups and update values of check nodes stored in the accessed memory area group.

12. The memory controller of claim 11, wherein each of the plurality of memory area groups include two or more memory area sub-groups, and a number of memory areas included in each of memory area sub-groups is determined based on a size of each of the sub-matrices,
   wherein each of the check node unit groups is accessible to the two or more memory area sub-groups included in a corresponding memory area group among the memory area groups.

13. The memory controller of claim 12, wherein each of the check node unit groups is configured to access a memory area sub-group corresponding to a first CPM included in the currently selected column layer among the accessible two or more memory area sub-groups.

14. The memory controller of claim 13, wherein each of the check node unit groups includes check node units, a number of the check node units being determined based on the size of each of the sub-matrices,
   wherein each of the check node units is accessible to any one memory area among memory areas included in a corresponding memory area sub-group with respect to each of the two or more memory area sub-groups.

15. The memory controller of claim 11, wherein a number of the check node unit groups matches a number of the row groups.

16. The memory controller of claim 11, wherein the check node unit groups update values of check nodes corresponding to a cyclic permutation matrix (CPM) included in the currently selected column layer in parallel.

* * * * *